US011269077B2

(12) United States Patent
Oh et al.

(10) Patent No.: US 11,269,077 B2
(45) Date of Patent: Mar. 8, 2022

(54) FLEXIBLE TEST BOARD TO IMPROVE SENSOR I/O COVERAGE FOR AUTONOMOUS DRIVING PLATFORM

(71) Applicant: Baidu USA LLC, Sunnyvale, CA (US)

(72) Inventors: Kwan Oh, Sunnyvale, CA (US);
Tiffany Zhang, Sunnyvale, CA (US);
Manjiang Zhang, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 320 days.

(21) Appl. No.: 16/457,315

(22) Filed: Jun. 28, 2019

(65) Prior Publication Data

US 2020/0408921 A1 Dec. 31, 2020

(51) Int. Cl.
| | | |
|---|---|---|
| *G05D 1/00* | (2006.01) | |
| *G01S 19/20* | (2010.01) | |
| *G01S 7/40* | (2006.01) | |
| *G01S 7/497* | (2006.01) | |
| *G01S 7/52* | (2006.01) | |

(52) U.S. Cl.
CPC ............ *G01S 19/20* (2013.01); *G05D 1/0055* (2013.01); *G01S 7/40* (2013.01); *G01S 7/497* (2013.01); *G01S 7/52004* (2013.01); *G05D 2201/0213* (2013.01)

(58) Field of Classification Search
CPC .......... G01S 19/20; G01S 19/42; G01S 19/28; G01S 19/09; G01S 19/24; G01S 5/0027; G05D 1/0055
USPC .................................................... 342/357.25
See application file for complete search history.

(56) References Cited

U.S. PATENT DOCUMENTS

| | | | |
|---|---|---|---|
| 10,086,782 B1* | 10/2018 | Konrardy | ............... G08B 21/18 |
| 2015/0346716 A1 | 12/2015 | Scharfe et al. | |
| 2017/0177954 A1 | 6/2017 | Micks et al. | |
| 2019/0004854 A1 | 1/2019 | Yang et al. | |
| 2020/0320807 A1* | 10/2020 | Gorti | .................... G07C 5/0808 |

FOREIGN PATENT DOCUMENTS

| | | |
|---|---|---|
| JP | 54010814 A | 1/1979 |
| JP | 08023336 A | 1/1996 |
| JP | 2016082403 A | 5/2016 |
| JP | 2019065409 A | 4/2019 |

* cited by examiner

*Primary Examiner* — Harry K Liu
(74) *Attorney, Agent, or Firm* — Womble Bond Dickinson (US) LLP

(57) ABSTRACT

Systems and methods are disclosed for performing manufacturing testing on an autonomous driving vehicle (ADV) sensor board. A sensor unit of the ADV includes a plurality of sensor I/O channels that provide information to the ADV perception and planning module, to navigate the ADV. An array of sensors is emulated on a sensor unit test board. The sensor unit includes a small software that manages the flow of testing the sensor unit. The sensor unit test board provides emulated sensor data for, e.g., GPS, LIDAR, RADAR, inertial measurement, one or more cameras, humidity, temperature, and pressure, and throttle, braking, and steering inputs. Each emulated sensor includes its own data validity checker to ensure that each sensor I/O channel of the sensor unit is tested. The sensor unit test board can include an LED for each I/O channel that indicates a pass/fail status of the test for the I/O channel.

24 Claims, 13 Drawing Sheets

FLEXIBLE TEST BOARD TO IMPROVE SENSOR I/O COVERAGE FOR AUTONOMOUS DRIVING PLATFORM

TECHNICAL FIELD

Embodiments of the present disclosure relate generally to operating autonomous vehicles. More particularly, embodiments of the disclosure relate to testing and implementation of sensor control systems.

BACKGROUND

Vehicles operating in an autonomous mode (e.g., driverless) can relieve occupants, especially the driver, from some driving-related responsibilities. When operating in an autonomous mode, the vehicle can navigate to various locations using onboard sensors, allowing the vehicle to travel with minimal human interaction or in some cases without any passengers.

Motion planning and control are critical operations in autonomous driving. However, conventional motion planning operations estimate the difficulty of completing a given path mainly from its curvature and speed, without considering the differences in features for different types of vehicles. Same motion planning and control is applied to all types of vehicles, which may not be accurate and smooth under some circumstances.

To implement motion planning, a sensor system gathers information about the environment surrounding the autonomous driving vehicle (ADV). The sensor system can include a global positioning system (GPS), a light detection and ranging (LIDAR) system, a radio detection and ranging (RADAR) system, one or more cameras, an ultra-sound system, and other sensors. The sensors can be interfaced to a sensor interface within a computing system of the ADV. The sensor interface can include a proprietary printed circuit board (PCB) that is manufactured for use with the computing system.

In factory testing, a GPS signal may not be available for testing a sensor PCB of the ADV for at least the reasons that a GPS sensor is very expensive and requires a line of sight to a global positioning satellite that may not be available inside of a factory environment. Further, an entire sensor array, including GPS, LIDAR, RADAR, camera, inertial measurement unit, ultrasonic sensor(s), global navigation satellite system, temperature, humidiyy, and pressure sensors, and position sensors for throttle, barking, and steering of the ADV may be physically very large and difficult to connect to a sensor PCB without first installing the sensor PCB into the ADV. Installing the sensor PCB into the ADV in order to test that the sensor PCB has been manufactured correctly, and without defects, is an inefficient way to test the sensor PCB. 2

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
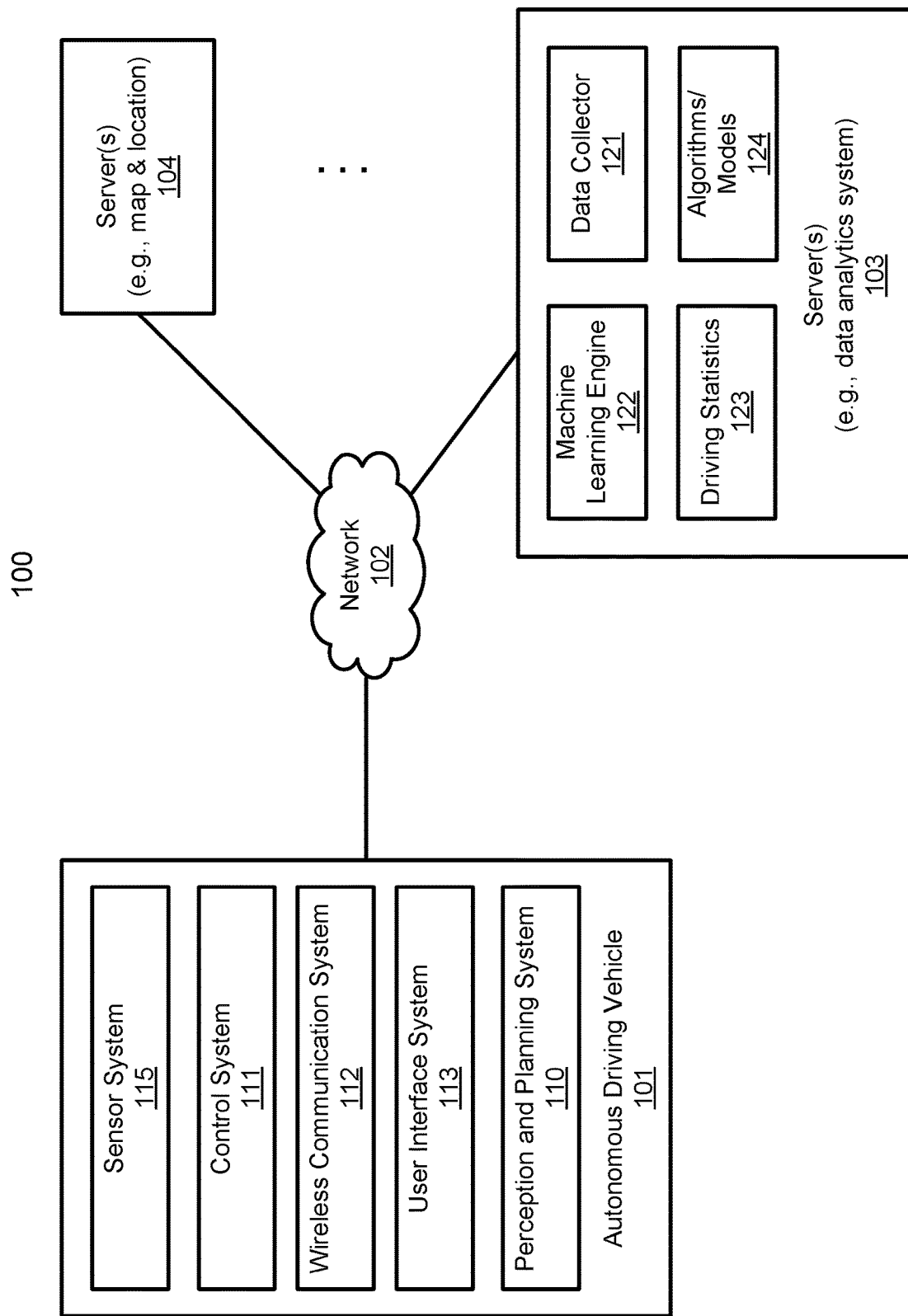
FIG. 1 is a block diagram illustrating a networked system according to one embodiment.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to some embodiments, a computer-implemented method of testing functionality of a sensor unit includes a sensor unit test board transmitting first emulated sensor data over a first channel corresponding to a first emulated sensor, to the sensor unit test. If the sensor unit is working correctly, the sensor unit will retrieve a time value from a time module on the sensor unit, and transmit the first emulated sensor data, along with the time value, back to the sensor unit test board. In an embodiment, the sensor unit can transform the received first emulated sensor data according to a predetermined rule. For example, sensor unit can perform format conversion and/or error checking on the received first emulated data. Second emulated sensor data can refer to either the first emulated sensor data, as received by the sensor unit, without transforming the received first emulated sensor data, or with transforming the received first emulated sensor data. The second emulated sensor data can then be transmitted back to the sensor unit test board. In response to the sensor unit test board detecting one or more errors in the second emulated data or the first time value, received back from the sensor unit, at least one first failure indication associated with the first emulated sensor data and first channel of the sensor unit under test is displayed and/or logged. In an embodiment, detecting one or more errors can include verifying, by a checker module of the sensor unit test board, that the first emulated data received back from the sensor unit and the first emulated data, transmitted from the sensor unit test board to the sensor unit, are the same. In an embodiment, detecting one or more errors can also include determining whether the format of the second emulated data, received back from the sensor unit, matches a data format for a real first sensor corresponding to the emulated first sensor, e.g. a GPS, LIDAR, camera, etc. In another embodiment, detecting one or more errors can further include verifying one or more of: a format of the time value generated by the sensor unit and received by the sensor unit test board, or a range of the time value. The first emulated sensor on the sensor unit test board can be an emulated global positioning satellite (GPS) sensor. Other emulated sensors can include a LIDAR sensor, a RADAR sensor, an inertial measurement unit (IMU) sensor, an ultrasonic senor, a global navigation satellite system (GNSS), a long term evolution (LTE) cellular transceiver, a camera, a temperature sensor, a humidity, a pressure sensor, and a position sensor for any/all of a throttle position, braking position, and steering position. In an embodiment, the first emulated sensor output can be passed to a second, and one or more subsequent, sensors such that emulated output from the second/subsequent emulated sensor(s) can be associated with the first and/or second emulated sensor output. For example, emulated GPS sensor output can be associated with one or more of an emulated LIDAR output, emulated camera output, and the like. The second/subsequent emulated sensor outputs can be associated with the first or second emulated sensor output at least via the time value associated with the second emulated sensor output. In an embodiment, third emulated sensor data can be generated by the sensor unit test board and transmitted to the senor unit being tested, over a second channel corresponding to a second emulated sensor, such as a LIDAR sensor. The sensor unit being tested can receive the third emulated sensor data over the second channel, and the sensor unit being tested can associate a second time value with the received second emulated sensor data. In an embodiment, the second time value can be the first time value, or a new time value read from the time module of the sensor unit under test. In an embodiment, the sensor unit can transform the received third emulated sensor data according to a predetermined rule. For example, sensor unit can perform format conversion and/or error checking on the received third emulated data. Fourth emulated sensor data can refer to either the third emulated sensor data, as received by the sensor unit, without transforming the received third emulated sensor data, or with transforming the received third emulated sensor data. The fourth emulated sensor data can then be transmitted back to the sensor unit test board. The sensor unit under test can transmit the fourth emulated sensor data, and second time value, back to the sensor unit test board. In response to the sensor unit test board detecting one or more errors in the received fourth emulated data or the second time value, the sensor unit test board can display at least one second failure indication associated with the second emulated sensor data and second channel of the sensor unit under test. The process for the second emulated sensor can be repeated for any number of channels and emulated sensors as may be configured for the sensor unit under test and the configuration of the sensor unit test board.

According to some embodiments, a sensor unit under test is a sensor unit, comprising a plurality of I/O channels, at least two I/O interfaces, and a time module. In an embodiment, the host computing system can be a part of the sensor unit under test. A first interface on the sensor unit under test can interface to a host computing system. The host computing can enable an operator to launch, monitor, and log testing of the sensor unit under test. In an embodiment, the host computing system can form a part of the sensor unit under test. A second interface of the sensor unit under test can interface to a sensor unit test board. The sensor unit test board can include functionality to generate emulated sensor data for a plurality of types of sensors and to check validity of such emulated sensor data. For each sensor emulator on the sensor unit test board, the sensor unit test board can transmit the emulated sensor output, and validate format and content of the sensor output. Testing software within the sensor unit under test can configure the sensor unit under test to select an I/O channel for testing. In an embodiment, the sensor unit can "ping" the sensor unit test board to provided emulated sensor output for a particular I/O channel. In an embodiment, the sensor unit test board can continuously output emulated sensor for each sensor at a periodic interface, over an I/O channel configured for use with the emulated sensor. For example, an emulated GPS output can be generated, and transmitted to the sensor unit under test, over I/O channel 1. Emulated LIDAR output can be generated and transmitted to the sensor unit under test over I/O channel 2. The same can be performed for, e.g. emulated RADAR over channel 3, emulated IMU over channel 4, emulated ultrasonic output over channel 5, emulated GNSS data over channel 6, emulated camera data over channel 7, and one or more of temperature, humidity pressure, and vehicle sensors for throttle, brake, and steering, each over a respective assigned I/O channel number. For each I/O channel of the sensor unit under test, the sensor unit under test can receive emulated sensor output from the sensor unit test board, optionally retrieve a time value, e.g. from a time module on sensor unit under test, and transmit the time value and received emulated sensor output over the respective I/O channel back to the sensor unit test board. The sensor unit under test can also transmit the same data over a corresponding I/O channel in the user interface to the host computing system, so that the host computing system may log the received, emulated test data for the emulated sensor and I/O channel. The process can be repeated for any number of configured I/O channels and sensor unit test board emulators and validity checkers.

In an embodiment, a non-transitory computer readable medium can store executable instructions that, when executed by a processing system having at least one hardware processor, can perform any of the functionality described above.

In yet another embodiment, a processing system having at least one hardware processor is coupled to a memory programmed with executable instructions can, when the instructions are executed by the processing system, perform any of the functionality described above.

Some embodiments described herein can include one or more application programming interfaces (APIs) in an environment with calling program code interacting with other program code being called through the one or more interfaces. Various function calls, messages, or other types of invocations, which further may include various kinds of parameters, can be transferred via the APIs between the calling program and the code being called. In addition, an API may provide the calling program code the ability to use data types or classes defined in the API and implemented in the called program code.

FIG. 1 is a block diagram illustrating an autonomous vehicle network configuration according to one embodiment of the disclosure. Referring to FIG. 1, network configuration 100 includes autonomous vehicle 101 that may be communicatively coupled to one or more servers 103-104 over a network 102. Although there is one autonomous vehicle shown, multiple autonomous vehicles can be coupled to each other and/or coupled to servers 103-104 over network 102. Network 102 may be any type of networks such as a local area network (LAN), a wide area network (WAN) such as the Internet, a cellular network, a satellite network, or a combination thereof, wired or wireless. Server(s) 103-104 may be any kind of servers or a cluster of servers, such as Web or cloud servers, application servers, backend servers, or a combination thereof. Servers 103-104 may be data analytics servers, content servers, traffic information servers, map and point of interest (MPOI) servers, or location servers, etc.

An autonomous vehicle refers to a vehicle that can be configured to in an autonomous mode in which the vehicle navigates through an environment with little or no input from a driver. Such an autonomous vehicle can include a sensor system having one or more sensors that are configured to detect information about the environment in which the vehicle operates. The vehicle and its associated controller(s) use the detected information to navigate through the environment. Autonomous vehicle 101 can operate in a manual mode, a full autonomous mode, or a partial autonomous mode.

In one embodiment, autonomous vehicle 101 includes, but is not limited to, perception and planning system 110, vehicle control system 111, wireless communication system 112, user interface system 113, infotainment system 114, and sensor system 115. Autonomous vehicle 101 may further include certain common components included in ordinary vehicles, such as, an engine, wheels, steering wheel, transmission, etc., which may be controlled by vehicle control system 111 and/or perception and planning system 110 using a variety of communication signals and/or commands, such as, for example, acceleration signals or commands, deceleration signals or commands, steering signals or commands, braking signals or commands, etc.

Components 110-115 may be communicatively coupled to each other via an interconnect, a bus, a network, or a combination thereof. For example, components 110-115 may be communicatively coupled to each other via a controller area network (CAN) bus. A CAN bus is a vehicle bus standard designed to allow microcontrollers and devices to communicate with each other in applications without a host computer. It is a message-based protocol, designed originally for multiplex electrical wiring within automobiles, but is also used in many other contexts.

Figure 2:
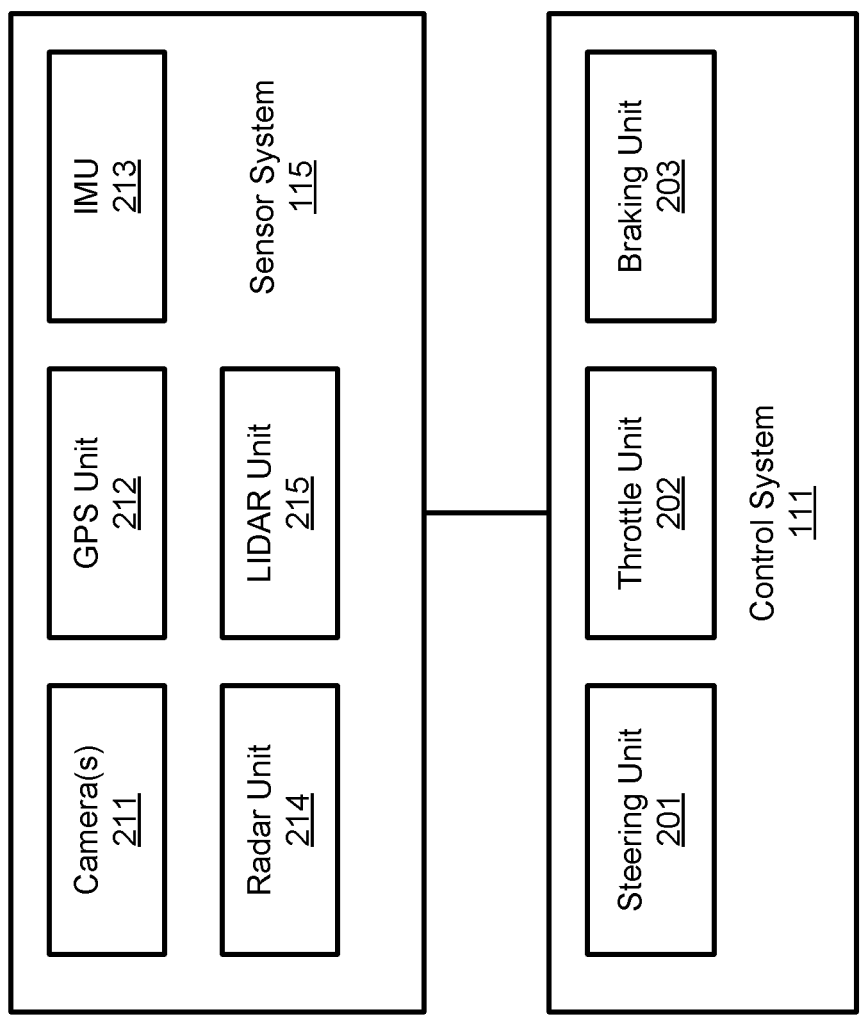
FIG. 2 is a block diagram illustrating an example of an autonomous vehicle according to one embodiment.

Referring now to FIG. 2, in one embodiment, sensor system 115 includes, but it is not limited to, one or more cameras 211, global positioning system (GPS) unit 212, inertial measurement unit (IMU) 213, radar unit 214, and a light detection and range (LIDAR) unit 215. GPS system 212 may include a transceiver operable to provide information regarding the position of the autonomous vehicle. IMU unit 213 may sense position and orientation changes of the autonomous vehicle based on inertial acceleration. Radar unit 214 may represent a system that utilizes radio signals to sense objects within the local environment of the autonomous vehicle. In some embodiments, in addition to sensing objects, radar unit 214 may additionally sense the speed and/or heading of the objects. LIDAR unit 215 may sense objects in the environment in which the autonomous vehicle is located using lasers. LIDAR unit 215 could include one or more laser sources, a laser scanner, and one or more detectors, among other system components. Cameras 211 may include one or more devices to capture images of the environment surrounding the autonomous vehicle. Cameras 211 may be still cameras and/or video cameras. A camera may be mechanically movable, for example, by mounting the camera on a rotating and/or tilting a platform.

Sensor system 115 may further include other sensors, such as, a sonar sensor, an infrared sensor, a steering sensor, a throttle sensor, a braking sensor, and an audio sensor (e.g., microphone). An audio sensor may be configured to capture sound from the environment surrounding the autonomous vehicle. A steering sensor may be configured to sense the steering angle of a steering wheel, wheels of the vehicle, or a combination thereof. A throttle sensor and a braking sensor sense the throttle position and braking position of the vehicle, respectively. In some situations, a throttle sensor and a braking sensor may be integrated as an integrated throttle/braking sensor.

In one embodiment, vehicle control system 111 includes, but is not limited to, steering unit 201, throttle unit 202 (also referred to as an acceleration unit), and braking unit 203. Steering unit 201 is to adjust the direction or heading of the vehicle. Throttle unit 202 is to control the speed of the motor or engine that in turn controls the speed and acceleration of the vehicle. Braking unit 203 is to decelerate the vehicle by providing friction to slow the wheels or tires of the vehicle. Note that the components as shown in FIG. 2 may be implemented in hardware, software, or a combination thereof.

Referring back to FIG. 1, wireless communication system 112 is to allow communication between autonomous vehicle 101 and external systems, such as devices, sensors, other vehicles, etc. For example, wireless communication system 112 can wirelessly communicate with one or more devices directly or via a communication network, such as servers 103-104 over network 102. Wireless communication system 112 can use any cellular communication network or a wireless local area network (WLAN), e.g., using WiFi to communicate with another component or system. Wireless communication system 112 could communicate directly with a device (e.g., a mobile device of a passenger, a display device, a speaker within vehicle 101), for example, using an infrared link, Bluetooth, etc. User interface system 113 may be part of peripheral devices implemented within vehicle 101 including, for example, a keyboard, a touch screen display device, a microphone, and a speaker, etc.

Some or all of the functions of autonomous vehicle 101 may be controlled or managed by perception and planning system 110, especially when operating in an autonomous driving mode. Perception and planning system 110 includes the necessary hardware (e.g., processor(s), memory, storage) and software (e.g., operating system, planning and routing programs) to receive information from sensor system 115, control system 111, wireless communication system 112, and/or user interface system 113, process the received information, plan a route or path from a starting point to a destination point, and then drive vehicle 101 based on the planning and control information. Alternatively, perception and planning system 110 may be integrated with vehicle control system 111.

For example, a user as a passenger may specify a starting location and a destination of a trip, for example, via a user interface. Perception and planning system 110 obtains the trip related data. For example, perception and planning system 110 may obtain location and route information from an MPOI server, which may be a part of servers 103-104. The location server provides location services and the MPOI server provides map services and the POIs of certain locations. Alternatively, such location and MPOI information may be cached locally in a persistent storage device of perception and planning system 110.

While autonomous vehicle 101 is moving along the route, perception and planning system 110 may also obtain real-time traffic information from a traffic information system or server (TIS). Note that servers 103-104 may be operated by a third party entity. Alternatively, the functionalities of servers 103-104 may be integrated with perception and planning system 110. Based on the real-time traffic information, MPOI information, and location information, as well as real-time local environment data detected or sensed by sensor system 115 (e.g., obstacles, objects, nearby vehicles), perception and planning system 110 can plan an optimal route and drive vehicle 101, for example, via control system 111, according to the planned route to reach the specified destination safely and efficiently.

Server 103 may be a data analytics system to perform data analytics services for a variety of clients. In one embodiment, data analytics system 103 includes data collector 121 and machine learning engine 122. Data collector 121 collects driving statistics 123 from a variety of vehicles, either autonomous vehicles or regular vehicles driven by human drivers. Driving statistics 123 include information indicating the driving commands (e.g., throttle, brake, steering commands) issued and responses of the vehicles (e.g., speeds, accelerations, decelerations, directions) captured by sensors of the vehicles at different points in time. Driving statistics 123 may further include information describing the driving environments at different points in time, such as, for example, routes (including starting and destination locations), MPOIs, road conditions, weather conditions, etc.

Based on driving statistics 123, machine learning engine 122 generates or trains a set of rules, algorithms, and/or predictive models 124 for a variety of purposes. Algorithms 124 can then be uploaded on ADVs to be utilized during autonomous driving in real-time.

Figure 3A:
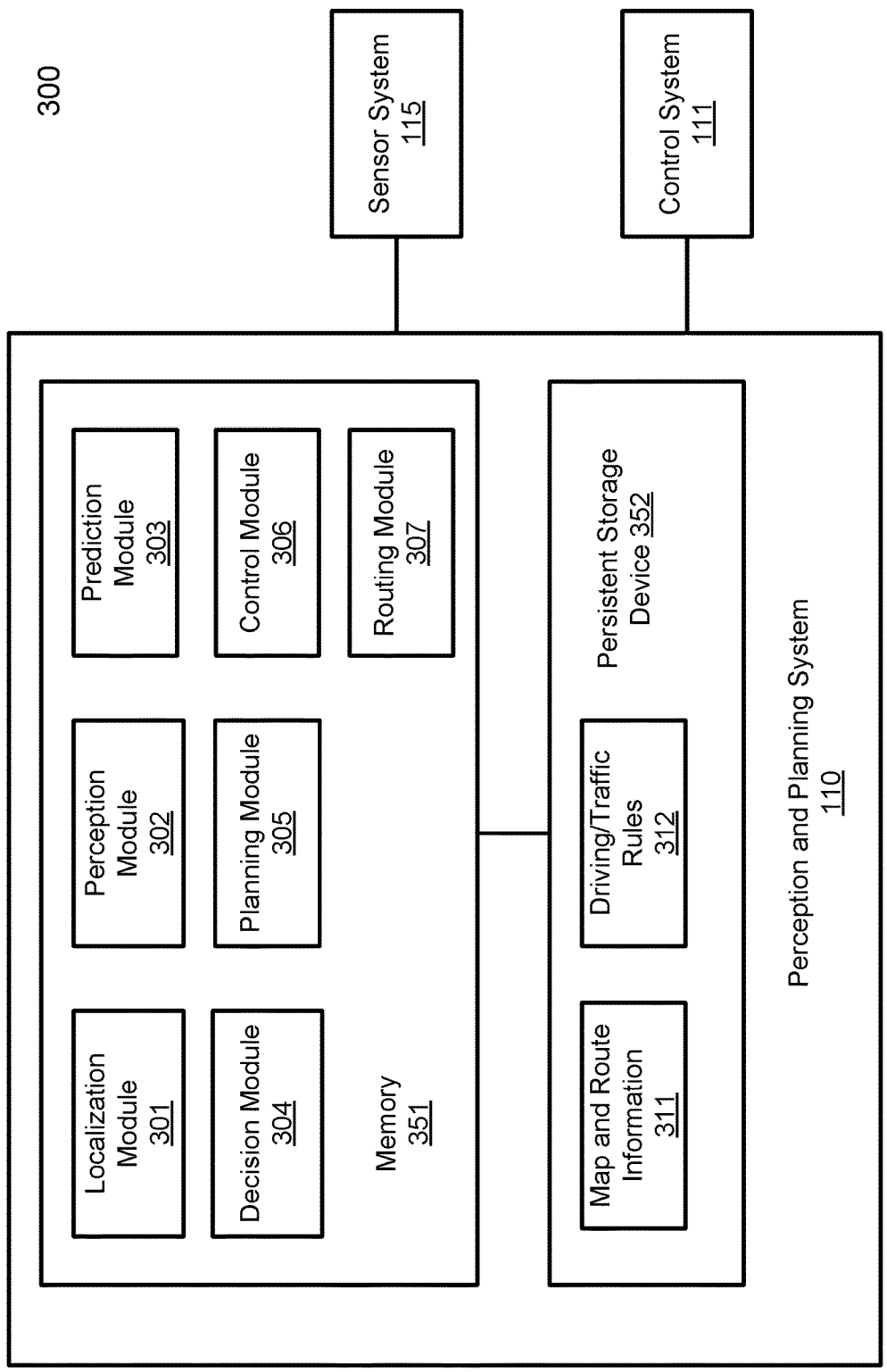
FIGS. 3A-3B are block diagrams illustrating an example of a perception and planning system used with an autonomous vehicle according to one embodiment.
Figure 3B:
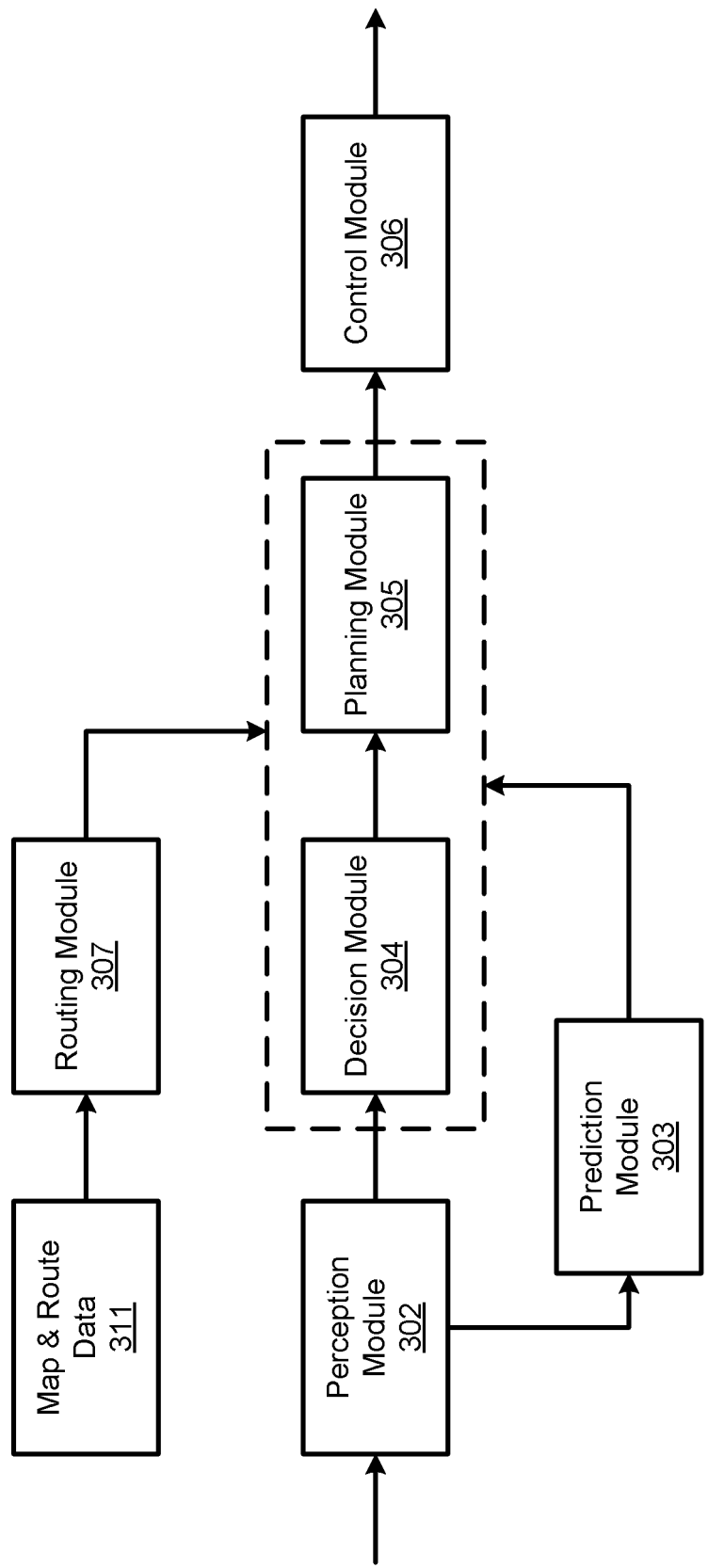

FIGS. 3A and 3B are block diagrams illustrating an example of a perception and planning system used with an autonomous vehicle according to one embodiment. System 300 may be implemented as a part of autonomous vehicle 101 of FIG. 1 including, but is not limited to, perception and planning system 110, control system 111, and sensor system 115. Referring to FIGS. 3A-3B, perception and planning system 110 includes, but is not limited to, localization module 301, perception module 302, prediction module 303, decision module 304, planning module 305, control module 306, routing module 307.

Some or all of modules 301-307 may be implemented in software, hardware, or a combination thereof. For example, these modules may be installed in persistent storage device 352, loaded into memory 351, and executed by one or more processors (not shown). Note that some or all of these modules may be communicatively coupled to or integrated with some or all modules of vehicle control system 111 of FIG. 2. Some of modules 301-307 may be integrated together as an integrated module.

Localization module 301 determines a current location of autonomous vehicle 300 (e.g., leveraging GPS unit 212) and manages any data related to a trip or route of a user. Localization module 301 (also referred to as a map and route module) manages any data related to a trip or route of a user. A user may log in and specify a starting location and a destination of a trip, for example, via a user interface. Localization module 301 communicates with other components of autonomous vehicle 300, such as map and route information 311, to obtain the trip related data. For example, localization module 301 may obtain location and route information from a location server and a map and POI (MPOI) server. A location server provides location services and an MPOI server provides map services and the POIs of certain locations, which may be cached as part of map and route information 311. While autonomous vehicle 300 is moving along the route, localization module 301 may also obtain real-time traffic information from a traffic information system or server.

Based on the sensor data provided by sensor system 115 and localization information obtained by localization module 301, a perception of the surrounding environment is determined by perception module 302. The perception information may represent what an ordinary driver would perceive surrounding a vehicle in which the driver is driving. The perception can include the lane configuration, traffic light signals, a relative position of another vehicle, a pedestrian, a building, crosswalk, or other traffic related signs (e.g., stop signs, yield signs), etc., for example, in a form of an object. The lane configuration includes information describing a lane or lanes, such as, for example, a shape of the lane (e.g., straight or curvature), a width of the lane, how many lanes in a road, one-way or two-way lane, merging or splitting lanes, exiting lane, etc.

Perception module 302 may include a computer vision system or functionalities of a computer vision system to process and analyze images captured by one or more cameras in order to identify objects and/or features in the environment of autonomous vehicle. The objects can include traffic signals, road way boundaries, other vehicles, pedestrians, and/or obstacles, etc. The computer vision system may use an object recognition algorithm, video tracking, and other computer vision techniques. In some embodiments, the computer vision system can map an environment, track objects, and estimate the speed of objects, etc. Perception module 302 can also detect objects based on other sensors data provided by other sensors such as a radar and/or LIDAR.

For each of the objects, prediction module 303 predicts what the object will behave under the circumstances. The prediction is performed based on the perception data perceiving the driving environment at the point in time in view of a set of map/rout information 311 and traffic rules 312. For example, if the object is a vehicle at an opposing direction and the current driving environment includes an intersection, prediction module 303 will predict whether the vehicle will likely move straight forward or make a turn. If the perception data indicates that the intersection has no traffic light, prediction module 303 may predict that the vehicle may have to fully stop prior to enter the intersection. If the perception data indicates that the vehicle is currently at a left-turn only lane or a right-turn only lane, prediction module 303 may predict that the vehicle will more likely make a left turn or right turn respectively.

For each of the objects, decision module 304 makes a decision regarding how to handle the object. For example, for a particular object (e.g., another vehicle in a crossing route) as well as its metadata describing the object (e.g., a speed, direction, turning angle), decision module 304 decides how to encounter the object (e.g., overtake, yield, stop, pass). Decision module 304 may make such decisions according to a set of rules such as traffic rules or driving rules 312, which may be stored in persistent storage device 352.

Routing module 307 is configured to provide one or more routes or paths from a starting point to a destination point. For a given trip from a start location to a destination location, for example, received from a user, routing module 307 obtains route and map information 311 and determines all possible routes or paths from the starting location to reach the destination location. Routing module 307 may generate a reference line in a form of a topographic map for each of the routes it determines from the starting location to reach the destination location. A reference line refers to an ideal route or path without any interference from others such as other vehicles, obstacles, or traffic condition. That is, if there is no other vehicle, pedestrians, or obstacles on the road, an ADV should exactly or closely follows the reference line. The topographic maps are then provided to decision module 304 and/or planning module 305. Decision module 304 and/or planning module 305 examine all of the possible routes to select and modify one of the most optimal routes in view of other data provided by other modules such as traffic conditions from localization module 301, driving environment perceived by perception module 302, and traffic condition predicted by prediction module 303. The actual path or route for controlling the ADV may be close to or different from the reference line provided by routing module 307 dependent upon the specific driving environment at the point in time.

Based on a decision for each of the objects perceived, planning module 305 plans a path or route for the autonomous vehicle, as well as driving parameters (e.g., distance, speed, and/or turning angle), using a reference line provided by routing module 307 as a basis. That is, for a given object, decision module 304 decides what to do with the object, while planning module 305 determines how to do it. For example, for a given object, decision module 304 may decide to pass the object, while planning module 305 may determine whether to pass on the left side or right side of the object. Planning and control data is generated by planning module 305 including information describing how vehicle 300 would move in a next moving cycle (e.g., next route/path segment). For example, the planning and control data may instruct vehicle 300 to move 10 meters at a speed of 30 mile per hour (mph), then change to a right lane at the speed of 25 mph.

Based on the planning and control data, control module 306 controls and drives the autonomous vehicle, by sending proper commands or signals to vehicle control system 111, according to a route or path defined by the planning and control data. The planning and control data include sufficient information to drive the vehicle from a first point to a second point of a route or path using appropriate vehicle settings or driving parameters (e.g., throttle, braking, steering commands) at different points in time along the path or route.

In one embodiment, the planning phase is performed in a number of planning cycles, also referred to as driving cycles, such as, for example, in every time interval of 100 milliseconds (ms). For each of the planning cycles or driving cycles, one or more control commands will be issued based on the planning and control data. That is, for every 100 ms, planning module 305 plans a next route segment or path segment, for example, including a target position and the time required for the ADV to reach the target position. Alternatively, planning module 305 may further specify the specific speed, direction, and/or steering angle, etc. In one embodiment, planning module 305 plans a route segment or path segment for the next predetermined period of time such as 5 seconds. For each planning cycle, planning module 305 plans a target position for the current cycle (e.g., next 5 seconds) based on a target position planned in a previous cycle. Control module 306 then generates one or more control commands (e.g., throttle, brake, steering control commands) based on the planning and control data of the current cycle.

Note that decision module 304 and planning module 305 may be integrated as an integrated module. Decision module 304/planning module 305 may include a navigation system or functionalities of a navigation system to determine a driving path for the autonomous vehicle. For example, the navigation system may determine a series of speeds and directional headings to affect movement of the autonomous vehicle along a path that substantially avoids perceived obstacles while generally advancing the autonomous vehicle along a roadway-based path leading to an ultimate destination. The destination may be set according to user inputs via user interface system 113. The navigation system may update the driving path dynamically while the autonomous vehicle is in operation. The navigation system can incorporate data from a GPS system and one or more maps so as to determine the driving path for the autonomous vehicle.

Sensor system 115 can be integrated with a sensor unit comprising one or more input/output (I/O) channels with which to receive sensor data for the plurality of sensors in sensor system 115. The sensor data can be provided to a perception and planning module 110. In an embodiment, some sensor data may be collected from, or provided to, one or more of the control system 111, wireless communication system 112, and user interface system 113. The sensor unit can be tested using a sensor unit test board that emulates at least the above-mentioned sensors, transmits the emulated sensor data to the sensor unit, the sensor unit adds a time value to the sensor data, and sends the sensor data back to the sensor unit test board to be validated. In an embodiment, during testing of the sensor unit, the sensor unit may also transmit one or more channels of emulated sensor data to a host computing system of the autonomous driving vehicle.

Steering unit 201, throttle unit 202, and braking unit 203 can provide sensor inputs to sensor system 115 which may be received by an integrating circuit boards ("sensor unit") of sensor system 115. The sensor unit may be factory testing using an sensor unit test board, configured to emulate sensor outputs, including position outputs from steering unit 201, throttle unit 202, and braking unit 203.

Wireless communication system 112 can provide sensor inputs to sensor system 115 which may be received by an integrating circuit boards ("sensor unit") of sensor system 115. The sensor unit may be factory testing using an sensor unit test board, configured to emulate sensor outputs, including communication outputs from wireless communication system 112.

Figure 4:
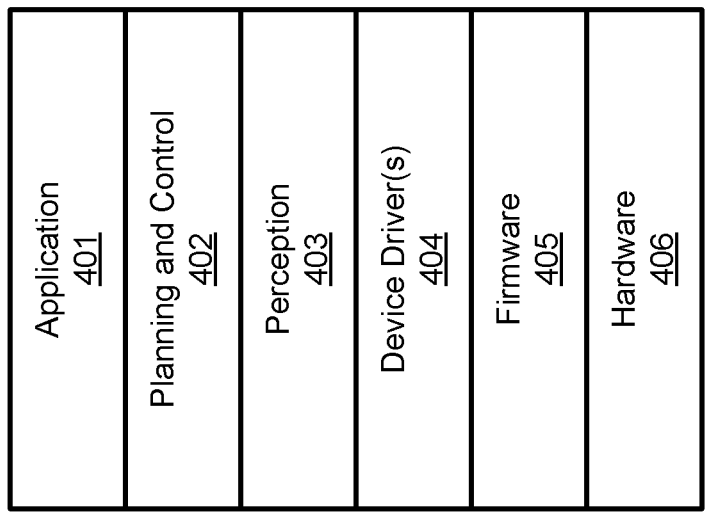
FIG. 4 is a block diagram illustrating architecture of an autonomous driving system according to one embodiment.

FIG. 4 is a block diagram illustrating system architecture 400 for autonomous driving according to one embodiment. System architecture 400 may represent system architecture of an autonomous driving system as shown in FIGS. 3A and 3B. Referring to FIG. 4, system architecture 400 includes, but it is not limited to, application layer 401, planning and control (PNC) layer 402, perception layer 403, driver layer 404, firmware layer 405, and hardware layer 406. Application layer 401 may include user interface or configuration application that interacts with users or passengers of an autonomous driving vehicle, such as, for example, functionalities associated with user interface system 113. PNC layer 402 may include functionalities of at least planning module 305 and control module 306. Perception layer 403 may include functionalities of at least perception module 302. In one embodiment, there is an additional layer including the functionalities of prediction module 303 and/or decision module 304. Alternatively, such functionalities may be included in PNC layer 402 and/or perception layer 403. System architecture 400 further includes driver layer 404, firmware layer 405, and hardware layer 406. Firmware layer 405 may represent at least the functionality of sensor system 115, which may be implemented in a form of a field programmable gate array (FPGA). Hardware layer 406 may represent the hardware of the autonomous driving vehicle such as control system 111. Layers 401-403 can communicate with firmware layer 405 and hardware layer 406 via device driver layer 404.

Figure 5A:
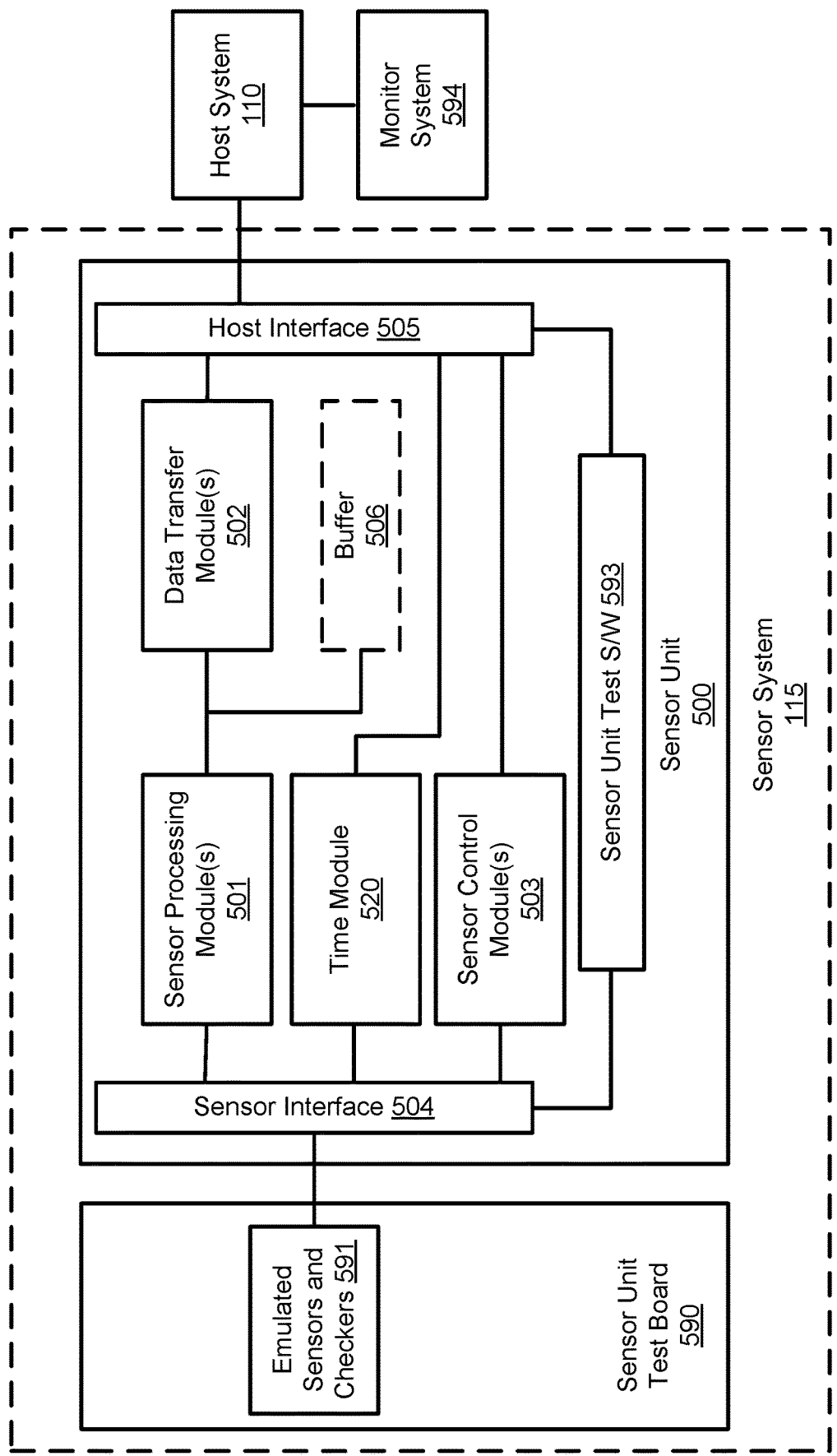
FIGS. 5A and 5B are block diagrams illustrating an example of a sensor unit coupled to a sensor unit test board to improve sensor I/O coverage for autonomous driving vehicles, according to one embodiment.

FIG. 5A is a block diagram illustrating an example of a sensor system 500 according to one embodiment of the invention. Referring to FIG. 5A, sensor system 115 includes a number of sensors 510 and a sensor unit 500 coupled to host system 110. Sensor unit 500 can be coupled to a sensor unit test board 590 to facilitate manufacturing testing of the sensor unit 500. Host system 110 represents a planning and control system as described above, which may include at least some of the modules as shown in FIGS. 3A and 3B. In an embodiment, host system 110 can be integrated into sensor system 115. Host system 110 can also be used by a manufacturing testing operator to run manufacturing testing of the sensor unit 500, using the sensor unit test board 590. Alternatively, or in addition, monitor system 594 can be used to facilitate manufacturing testing of the sensor unit 500. Host system 110 and monitor system 594 can comprise hardware as described below with reference to FIG. 11. Sensor unit 500 can include sensor unit test software 593 that configures the sensor unit 500 for manufacturing testing.

Sensor unit 500 may be implemented in a form of an FPGA device or an ASIC (application specific integrated circuit) device. In one embodiment, sensor unit 500 includes, amongst others, one or more sensor data processing modules 501 (also simply referred to as sensor processing modules), data transfer modules 502, and sensor control modules or logic 503. Modules 501-503 can communicate with sensors 510 via a sensor interface 504 and communicate with host system 110 via host interface 505. Optionally, an internal or external buffer 506 may be utilized for buffering the data for processing.

In one embodiment, for the receiving path or upstream direction, sensor processing module 501 is configured to receive sensor data from a sensor via sensor interface 504 and process the sensor data (e.g., format conversion, error checking), which may be temporarily stored in buffer 506. Data transfer module 502 is configured to transfer the processed data to host system 110 using a communication protocol compatible with host interface 505. Similarly, for the transmitting path or downstream direction, data transfer module 502 is configured to receive data or commands from host system 110. The data is then processed by sensor processing module 501 to a format that is compatible with the corresponding sensor. The processed data is then transmitted to the sensor.

In one embodiment, sensor control module or logic 503 is configured to control certain operations of sensors 510, such as, for example, timing of activation of capturing sensor data, in response to commands received from host system (e.g., perception module 302) via host interface 505. Host system 110 can configure sensors 510 to capture sensor data in a collaborative and/or synchronized manner, such that the sensor data can be utilized to perceive a driving environment surrounding the vehicle at any point in time.

Sensor interface 504 can include one or more of Ethernet, USB (universal serial bus), LTE (long term evolution) or cellular, WiFi, GPS, camera, CAN, serial (e.g., universal asynchronous receiver transmitter or UART), SIM (subscriber identification module) card, and other general purpose input/output (GPIO) interfaces. Host interface 505 may be any high speed or high bandwidth interface such as PCIe (peripheral component interconnect or PCI express) interface. Sensors 510 can include a variety of sensors that are utilized in an autonomous driving vehicle, such as, for example, a camera, a LIDAR device, a RADAR device, a GPS receiver, an IMU, an ultrasonic sensor, a GNSS (global navigation satellite system) receiver, an LTE or cellular SIM card, vehicle sensors (e.g., throttle, brake, steering sensors), and system sensors (e.g., temperature, humidity, pressure sensors), etc.

For example, a camera can be coupled via an Ethernet or a GPIO interface. A GPS sensor can be coupled via a USB or a specific GPS interface. Vehicle sensors can be coupled via a CAN interface. A RADAR sensor or an ultrasonic sensor can be coupled via a GPIO interface. A LIDAR device can be coupled via an Ethernet interface. An external SIM module can be coupled via an LTE interface. Similarly, an internal SIM module can be inserted onto a SIM socket of sensor unit 500. The serial interface such as UART can be coupled with a console system for debug purposes.

Emulated sensors 591 provide functionality similar to sensors 211-215 of sensor 115, described above with reference to FIG. 2. Note that emulated sensors 591 can be any kind of sensors and provided by various vendors or suppliers. Sensor processing module(s) 501 is configured to handle different types of sensors and their respective data formats and communication protocols. According to one embodiment, each of emulated sensors 591 is associated with a specific channel for processing sensor data and transferring the processed sensor data between host system 110 and the corresponding sensor. Each channel includes a specific sensor processing module and a specific data transfer module that have been configured or programmed to handle the corresponding sensor data and protocol, as shown in FIG. 5B.

Figure 5B:
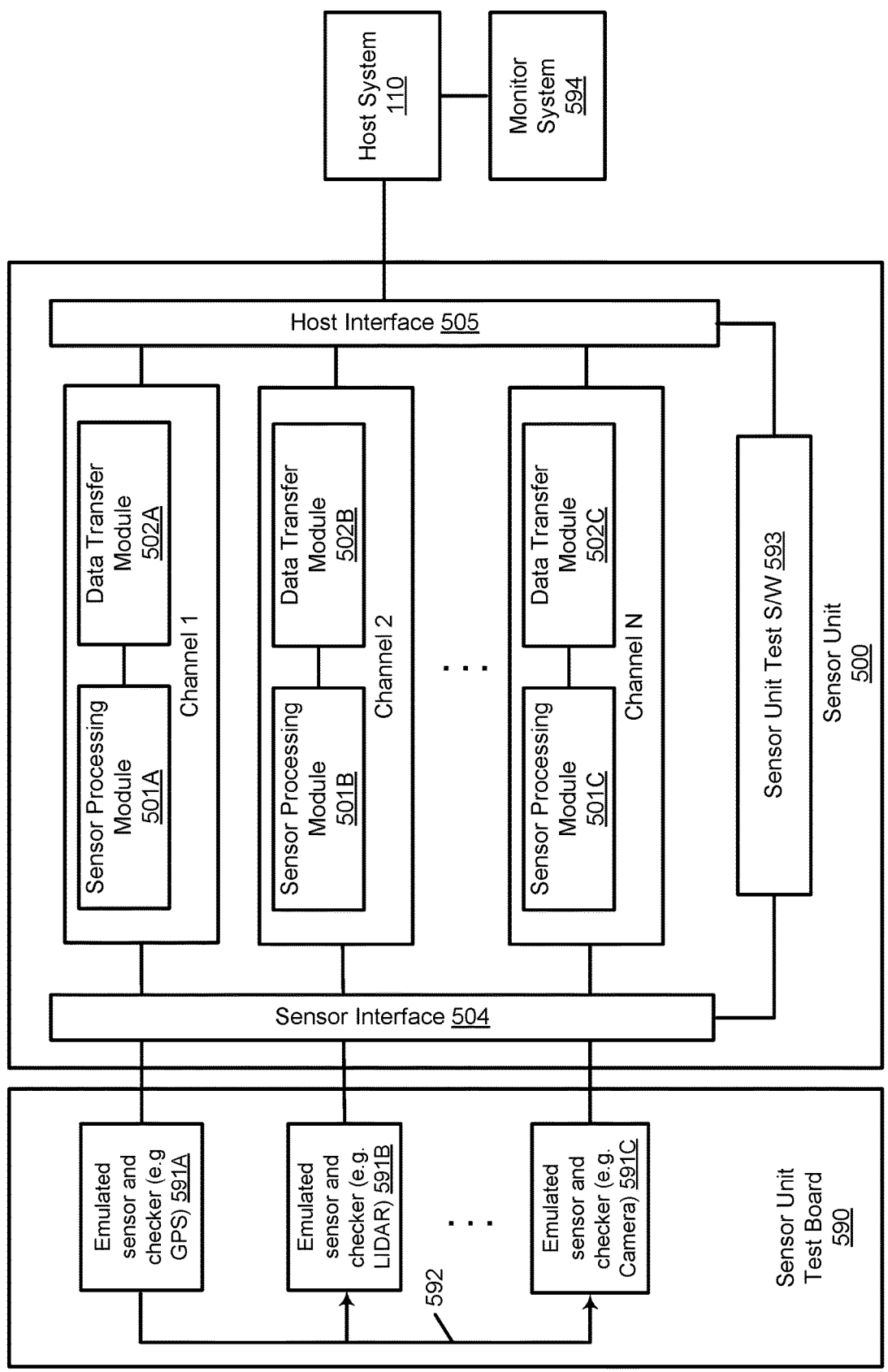

Referring now to FIG. 5B, sensor processing modules 501A-501C are specifically configured to process sensor data obtained from emulated sensors 591A-591C respectively, of sensor unit test board 590, during manufacturing testing of sensor unit 500. When the sensor unit 500 is integrated into an ADV 100, the sensor unit will be coupled to actual real-world sensors corresponding to the emulated sensor 591A-591C. Note that emulated sensors 591A-591C may be the same or different types of sensors. Sensor processing modules 501A-501C can be configured (e.g., software configurable) to handle different sensor processes for different types of sensors. For example, if emulated sensor 591A is a camera, processing module 501A can be figured to handle pixel processing operations on the specific pixel data representing an image captured by camera 591A. Similarly, if emulated sensor 591A is a LIDAR device, processing module 501A is configured to process LIDAR data specifically. That is, according to one embodiment, dependent upon the specific type of a particular sensor, its corresponding processing module can be configured to process the corresponding sensor data using a specific process or method corresponding to the type of sensor data.

Similarly, data transfer modules 502A-502C can be configured to operate in different modes, as different kinds of sensor data may be in different size or sensitivities that require different speed or timing requirement. According to one embodiment, each of data transfer modules 502A-502C can be configured to operate in one of a low latency mode, a high bandwidth mode, and a memory mode (also referred to as a fixed memory mode).

When operating in a low latency mode, according to one embodiment, a data transfer module (e.g., data transfer module 502) is configured to send the sensor data received from a sensor to the host system as soon as possible without or with minimum delay. Some of sensor data are very sensitive in terms of timing that need to be processed as soon as possible. Examples of such sensor data include vehicle status such as vehicle speed, acceleration, steering angle, etc.

When operating in a high bandwidth mode, according to one embodiment, a data transfer module (e.g., data transfer module 502) is configured to accumulate the sensor data received from a sensor up to a predetermined amount, but is still within the bandwidth the connection between the data transfer module and the host system 110. The accumulated sensor data is then transferred to the host system 110 in a batch that maximum the bandwidth of the connection between the data transfer module and host system 110. Typically, the high bandwidth mode is utilized for a sensor that produces a large amount of sensor data. Examples of such sensor data include camera pixel data.

When operating in a memory mode, according to one embodiment, a data transfer module is configured to write the sensor data received from a sensor directly to a memory location of a mapped memory of host system 110, similar to a shared memory page. Examples of the sensor data to be transferred using memory mode include system status data such as temperature, fans speed, etc.

Similarly, each channel may be associated with a specific sensor control module, such as sensor control module 503, which is configured to control or trigger the operations of a corresponding sensor. Time module 520 is coupled to the components of each of the channels to provide time services such as timestamps to a sensor and its corresponding sensor processing module, sensor control module, and/or data transfer module of the channel.

According to one embodiment, each data transfer module includes a transmitting (TX) module and a receiving (RX) module. The TX module is responsible for transmitting data or commands from host system 110 to a sensor. The RX module is responsible for receiving sensor data from a sensor and sending the received sensor data to host system 110. According to one embodiment, in response to a request to send data and/or commands to a sensor, the TX module requests and receives a pointer pointing to a TX descriptor buffer that has been set up by the host system, which may be stored as a part of TX descriptor buffer information. The descriptor buffer information includes metadata describing a TX buffer which has been mapped to a host system memory of host system 110. The mapped memory region is configured to store the data and/or commands to be sent to the sensor. In one embodiment, the TX descriptor includes one or more memory block entries. Each memory block entry includes information specifying a starting address of a memory block and a size of the memory block. The data to be sent may be temporarily stored in buffer 506, where the data can be further processed by a corresponding sensor processing module. Alternatively, the sensor processing module can directly process the data from the mapped host memory via the descriptor buffer.

According to one embodiment, when a signal is received indicating that there are sensor data generated from a sensor and may be processed by a corresponding sensor processing module, the RX module sends a request to host system 110 to request memory pages to be allocated to receive the data generated from the sensor. The RX module then receives RX buffer tables from host system 110. The RX buffer tables may include multiple levels (e.g., N levels) of mapping tables. In one embodiment, the top level buffer table includes an RX page directory table. In one embodiment, the RX page directory table includes one or more page table entries. Each page table entry stores a memory address of a particular page table (e.g., a next level table). Each page table entry includes information specifying a start address of a memory page (e.g., a fixed memory page as a next level table) of the host memory of host system 110. There can be N levels of linked tables between the top level table and the memory pages of the host memory of host system 110. Each parent level table includes an address or link referencing to a child level table in a hierarchical structure.

When sensor unit test software 593 configures sensor unit 500 in a manufacturing test mode, sensor unit 500 can select an I/O channel of sensor interface 504 to test. The selected I/O channel, e.g. I/O channel 1, can be associated with a particular emulated sensor, e.g. 591A. In an embodiment, emulated sensor 591A can be a GPS sensor. In an embodiment, sensor unit 500 can "ping" emulated sensor 591A-591C associated with the selected I/O channel so that the emulated sensor 591A-591C will generate emulated sensor output data and transmit that emulated sensor output data over the selected I/O channel to the sensor unit 500. Sensor unit test board 590 may set a timer indicating how long the sensor unit test board 590 should wait ("listen") for a response from the sensor unit 500 on the selected I/O channel before determining that the sensor unit 500 has failed to respond back to the sensor unit test board 590 on the selected I/O channel. If a timeout occurs, then sensor unit test board 590 can set a visual indicator (e.g. an LED on the sensor unit test board, set to RED) that the sensor unit 500 has failed a test of the selected channel I/O. During the time for response, the sensor unit 500 can receive the emulated sensor output over the selected I/O channel. In an embodiment, the sensor unit can retrieve a time value from time module 520. Sensor unit 500 can then transmit the emulated sensor data received from the sensor unit test board 590, over the selected I/O channel, back to the sensor unit test board 590 along with the time value. In an embodiment, sensor unit 500 can be configured to also transmit the emulated sensor data received from the sensor unit test board to the host system 110 and/or the monitor system 594, for logging. The sensor unit test board 590 can then receive the emulated sensor data and time value over the selected I/O channel, from the sensor unit 500, and the sensor unit test board 590 can perform validity checking on the received data to determine whether the sensor unit 500 is transmitting valid data and therefore is functioning properly.

In an embodiment, each emulated sensor generates a different format of data that is appropriate for the sensor type being emulated. Thus, each emulated sensor has a validity checker associated with the particular emulated sensor 591A-591C. For example, a validity checker for an emulated GPS signal can check for valid format of the GPS data, valid ranges in sub-fields of the GPS data, a valid checksum or other data transmission validity checking method.

For an emulated LIDAR sensor, data may be valid if it follows Common Lidar Data Exchange Format (LAS, e.g. LAS Specification 1.4-R13, 15 Jul. 2013), which may include a header block, variable length data records, point data records, and extended variable length records. LIDAR sensor data which is raw data may vary by manufacturer and can include a time-of-flight value, and may further include pitch, yaw, sideline distortion.

For an emulated RADAR sensor, data may be valid if it follows the Eurocontrol Asterix format. Validity may also be determined based upon valid range values for the sub-fields of the sensor data.

For an emulated inertial measurement unit (IMU) sensor, sensor data may be valid if sub-fields of the IMU data fall within reasonable values for an ADV 100, including values for pitch, roll, and yaw.

For an emulated sensor producing camera data, data may be valid if it adheres to a valid camera image file format (CIFF) or CR2, e.g. by Canon®. Emulated camera sensor data may also be in a recognized file format, such as JPG, JPEG, TIFF, PNG, or other file format. The validity checker for emulated sensor data can be manufacturer-specific, and can be configured within the emulated sensor validity checker.

For emulated vehicle sensor data, e.g. throttle position, brake position, and steering position, the validity may be checked according to a proprietary format, such as percentage of brake or throttle applied (0 . . . 100%), an amount of steering input applied, 0 . . . 100%, left or right, or other format.

For emulated temperature, humidity, and pressure sensors, the data may be validated using a mapping of percentage of humidity, degrees of temperature, of pounds of pressure, by any known mapping from the output (e.g. analog output value of a sensor) to real-world values, and then range checked for reasonableness. E.g. humidity greater than 100% may be invalid. Temperature greater than 150° F. may be invalid. Pressure about 50 PSI (pounds per square inch) may be invalid.

If the emulated sensor data is received by the sensor unit test board 590 within the timer for response, and the received data is valid, then a visual indicator can be set indicating successful testing of the sensor unit 500 on the selected I/O channel, e.g. by an LED showing a GREEN indicator. Otherwise a visual indicator of failure can be indicated, e.g. by an LED showing a RED indicator. In an embodiment, for at least, e.g., the first selected I/O channel corresponding to a first emulated sensor, e.g. an emulated GPS, the sensor unit test board 590 can replicate the emulated sensor output data, and time value received from the sensor unit 500, for the first selected I/O channel, to one or more of the other emulated sensors 591B-591C. Validity checkers of emulated sensors 591B-591C can use the replicated data of emulated sensor 591A as an additional validity check on the emulated sensor data and time value(s) received from sensor board 500 for I/O channels 2 . . . N, where N is the number of configured I/O channels to test by the sensor unit test board 490. After all configured I/O channels on the sensor unit test board 590 have been tested, if any I/O channel of sensor 1 . . . N of sensor unit 500 failed, then an overall failure of the sensor board 500 can be indicated by a visual indicator, e.g., an LED indicating RED. If the sensor unit 500 has no I/O channel failures, then an overall success of the testing of the sensor board 500 can be indicated by a visual indicator, e.g., an LED indicating GREEN. Alternatively, or in addition, an overall success or failure of the testing of the sensor unit 500 can be indicated on the host system 110 and/or the monitor system 594.

Figure 6:
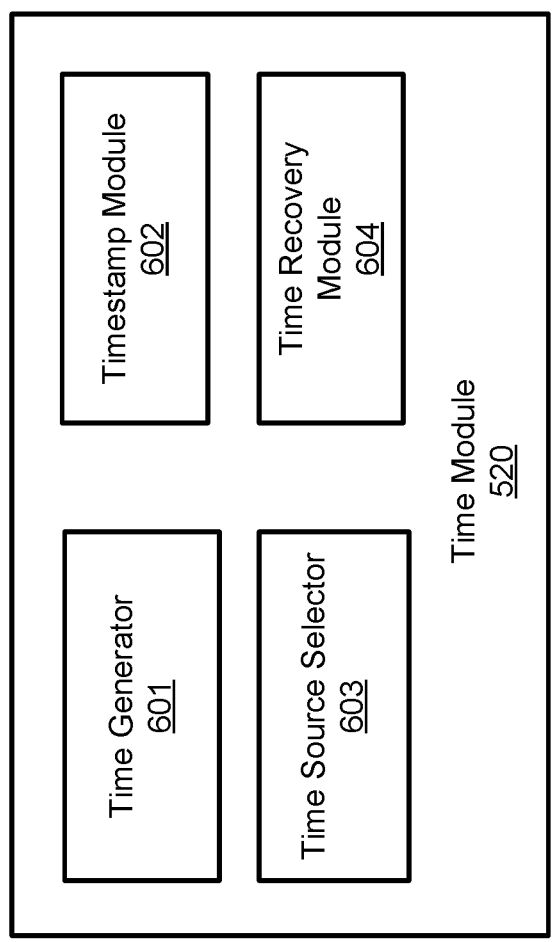
FIG. 6 is block diagram illustrating a time module of a sensor unit for use in an autonomous driving vehicle, that can be tested with a sensor unit test board, according to an embodiment.

FIG. 6 is a block diagram illustrating an example of a time module according to one embodiment. Referring to FIG. 6, time module 520 includes, but it is not limited to, time generator 601, timestamp module 602, time source selector 603, and time recovery module 604. Time generator 601 is configured to generate time based on a time source, where the time can be utilized by other components such as sensor processing modules and sensor control modules. Timestamp module 602 is configured to generate and provide timestamps to other components based on the time provided by time generator 601. When a primary time source is unavailable, time source selector 603 is configured to select an alternative time source to generate the time. When there is no time source available, time recovery module 604 is configured to recover the time when a time source becomes available.

Figure 7:
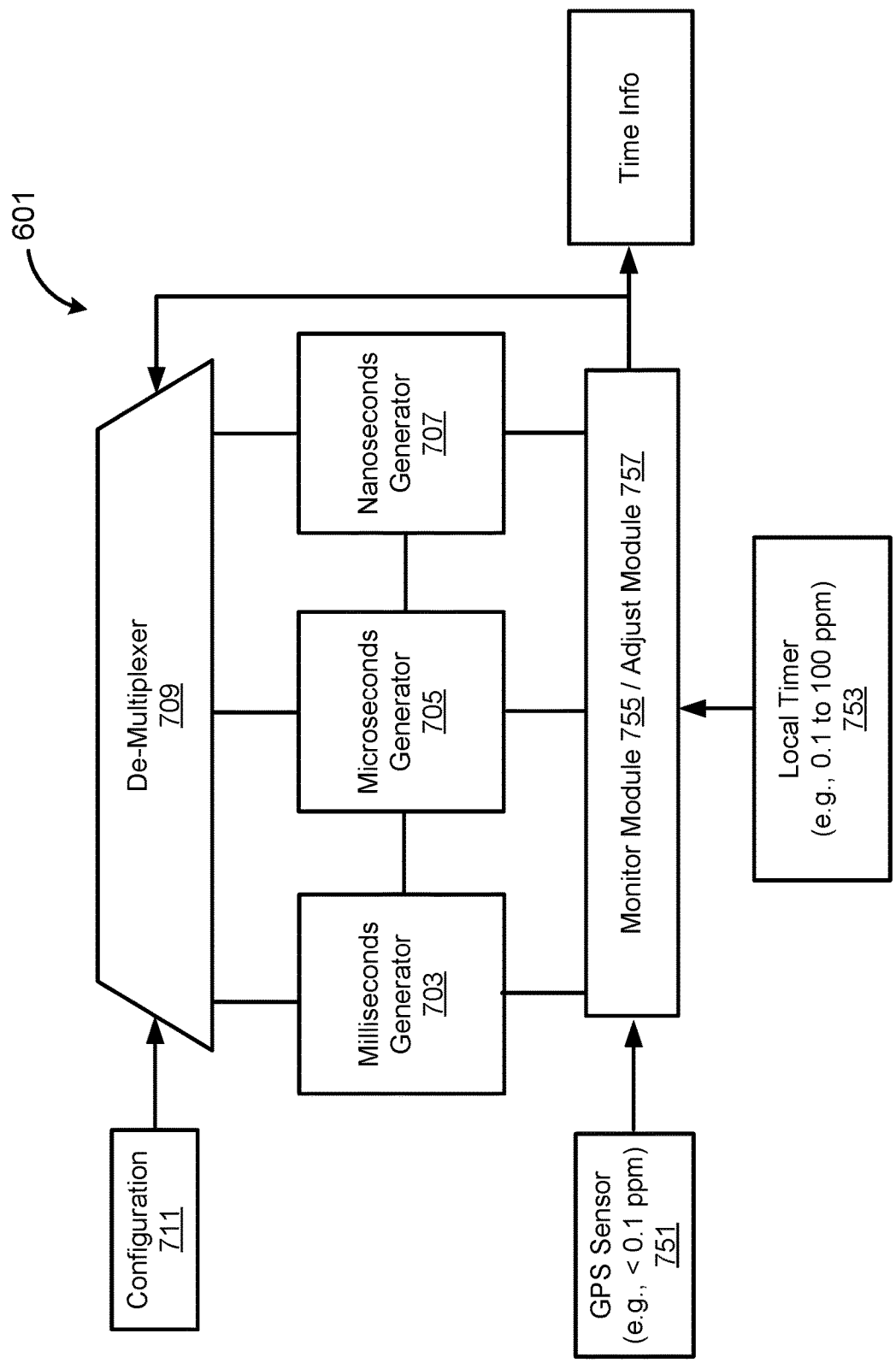
FIG. 7 is a block diagram illustrating an example of a time generator according to one embodiment.

FIG. 7 is a block diagram illustrating an example of a time generator according to one embodiment. Referring to FIG. 7, time generation unit 601 can include monitor module 755, adjust module 757, millisecond generator 703, microsecond generator 705, nanosecond generator 707, de-multiplexer 709, and configuration 711. Millisecond generator 703, microsecond generator 705, and nanosecond generator 707 can generate millisecond, microsecond, and nanosecond oscillation cycles respectively (e.g., oscillator counters at three different granularities) based on an oscillator of local timer 753. Configuration 711 can configure a select signal to select which of the outputs for millisecond generator 703, microsecond generator 705, and nanosecond 707 are to be routed to monitor module 755. Monitor module 755 can monitor the generated oscillation cycles to count these cycles. Adjust module 757 can adjust the counts (or modifies the count representations) so to sync the local timer 753 with a PPS signal from GPS sensor 751. In one embodiment, select signal for configuration 711 can be programmed by a user of sensor unit 500 or by monitor module 755/adjust module 757 in a feedback loop. For example, a user can configure to disable the millisecond generator if it is determined that local timer 753 is relatively precise.

Depending on the type of crystal oscillators used, local timer 753 can have an accuracy ranging from 0.1 to 100 ppm, e.g., any pulse can be off by 0.1 to 100 microseconds, whereas the pulse per second (PPS) signal from GPS sensor 751 has an accuracy rate of less than 0.1 ppm, or less than 0.1 microseconds of deviations for each pulse for each second. For a 0.1 ppm GPS PPS signal, a received PPS signal from GPS sensor 751 can assert consecutive pulses to be between 999,999.9 and 1,000,000.1 microseconds every second, while a typical 100 ppm local timer 753 can assert consecutive pulses to be between 999,900 and 1,000,100 microseconds every second. Furthermore, the variations in deviations of the pulses for local timer 753 can change in real-time due to changes in ambient temperature of the crystal oscillator ICs using by local timer 753. Thus, an objective is to adjust or sync local timer 753 to match GPS sensor 751 in real-time.

To sync local timer 753 to GPS sensor 751, in one embodiment, GPS sensor 751 receives a GPS pulse signal (PPS) that is a RF signal transmitted by a satellite broadcasting its signal in space with a certain accuracy rate, e.g., <0.1 ppm. In some embodiments, GPS sensor 751 receives the PPS signal from a first GPS satellite followed by a PPS signal from a second GPS satellite if the first GPS satellite is out of range. Because GPS satellites use its own precise measure of time with each satellite having its own on-board set of atomic clocks, PPS signals from the GPS satellites can be viewed as one or more reference timers. Note, however, because local timer 753 is adjusted in real-time to match any one GPS PPS signal, it is assumed that any time discrepancies when GPS PPS signals of two or more different GPS satellites are not a concern since the local timer 753 can be synced smoothly in real-time, as described further below.

Once a GPS PPS signal is received, monitor module 755 can determine any offsets of a time of the PPS signal and a time for local timer 753 and can generate a second local real-time clock/timer based on the determined offsets. For example, based on the PPS signal, date and time information (Coordinated Universal Time or UTC format) can initially be provided by GPS (National Marine Electronics Association) NMEA data information, accurate up to the seconds. Next, in one embodiment, milliseconds generator 703 can generate a close-to-one-millisecond oscillation count (e.g., a first granularity) using local timer 753. The close-to-one-millisecond oscillation count can be generated using a frequency divider circuit to divide a signal frequency of the local timer 753. Monitor module 755 may then detect or count a number of cycles (e.g., 999 cycles) from milliseconds generator 703 for a GPS PPS signal time interval of one second, e.g., local timer 753 lags the GPS PPS signal by about one millisecond. Because milliseconds generator 703 lags the GPS PPS, in one embodiment, adjust module 757 adjusts the milliseconds generator output to represent 1.001 milliseconds per oscillation. Milliseconds generator 703 then generates the following 1000 oscillation representations for each second: 0.000, 1.001, 2.002, . . . , 999.999, and 1001 milliseconds. So the 999$^{th}$ cycle from milliseconds generator 703 counts to 999.999 milliseconds.

Next, microseconds generator 705 can generate a close-to-one-microsecond oscillation count using local timer 753. The close-to-one-microsecond oscillation count (e.g., a second granularity) can be generated using a second frequency divider circuit to divide a signal frequency of the local timer 753. Monitor module 755 may count 998 cycles from microseconds generator 705 or a 2 microseconds offset for a GPS PPS time interval of one millisecond. Again, because microseconds generator 605 lags the GPS PPS, adjust module 757 adjusts the microseconds generator output to represent 1.002 microseconds per oscillation. The microseconds generator then generates the following 1000 oscillation representations for each millisecond: 0.000, 1.002, 2.004, . . . , 999.996, 1000.998, and 1002 microseconds. So the 998$^{th}$ cycle counts to 999.996 microseconds.

Next, nanoseconds generator 707 can generate a close-to-one-nanosecond oscillation count using local timer 753. The close-to-one-nanosecond oscillation count (e.g., a third granularity) can be generated using a third frequency divider circuit to divide a signal frequency of the local timer 753. Monitor module 755 may count 997 cycles from nanoseconds generator 707 or detect a 3 nanoseconds offset for a GPS PPS signal time interval of one microsecond. Again, adjust module 757 can adjust the nanoseconds generator output to represent 1.003 nanosecond per oscillation. The nanoseconds generator then generates the following 1000 oscillation representations for each microsecond: 0.000, 1.003, 2.006, . . . , 999.991, 1000.994, 1001.997, and 1003 nanoseconds. So the 997$^{th}$ cycle from the nanoseconds generator 607 counts to 999.991 nanoseconds. This way, any of the generator outputs (e.g., representations) or a combination thereof, can generate a high precision time in real-time. The high precision time can then be provided to the sensors of sensor unit 500. In the above example, the generated time has a precision up to one nanosecond using the nanoseconds generator. Note, although three generators (e.g., three granularities) are described, any number of generators and granularities can be used to generate a high precision time.

In some embodiment, configuration 711 can selectively enable/disable, via de-multiplexer 709, any of generators 703-707. The selectivity can turn on/off any of the generators. Selectivity is useful to select a subset of the generator outputs (e.g., only nanosecond generator) when only a subset of the outputs is required. In another embodiment, monitor module 755 buffers (e.g., saves) the offsets for the different granularities and maintaining the first, second, and third count values (e.g., value representations per oscillation) if a GPS sensor signal is lost, until the GPS sensor signal is again regained.

Figure 8:
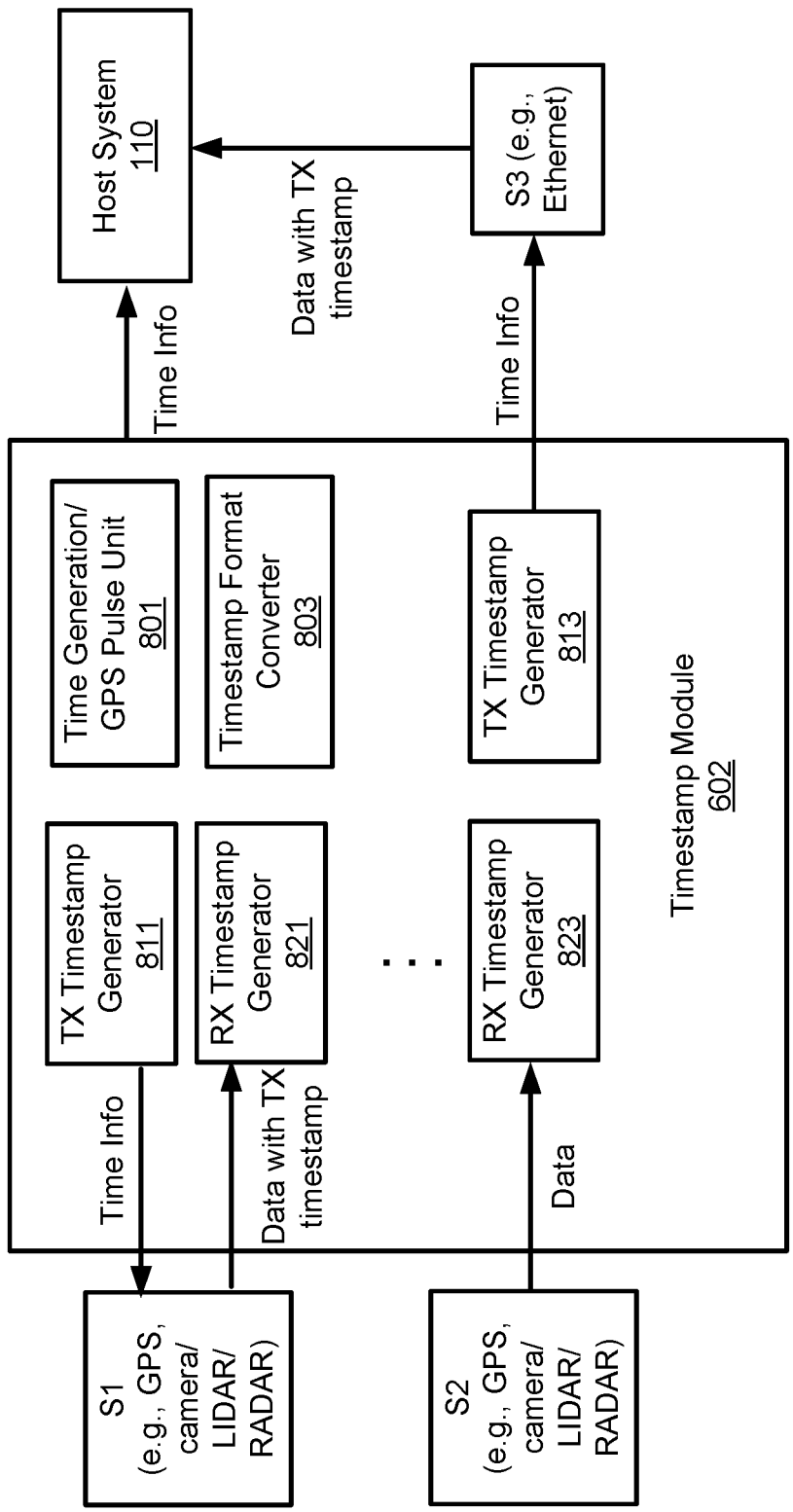
FIG. 8 is block diagram illustrating a timestamp module of a sensor unit for use in an autonomous driving vehicle, that can be tested with a sensor unit test board, according to an embodiment.

FIG. 8 is a block diagram illustrating an example of a timestamp module according to one embodiment. Referring to FIG. 8, timestamp module 602, also referred to as a timestamp sync hub device, includes time generation or GPS pulse unit 801, timestamp format converters 803, TX timestamp generators 811-813 and RX timestamp generators 821-823. Note that some or all of these modules or components can be integrated into fewer numbers of modules. Timestamp sync hub device 602 is coupled to a number of sensors (e.g., S1, S2, and S3) to provide TX/RX and/or trigger timestamps for the sensors. Time generation or GPS pulse unit 801 can generate a time or provide a GPS pulse for the sensors S1-S3. Timestamp format converter 803 can convert one timestamp format to another, for example, a timestamp may be converted from a format of ms:us:ns:mm:ss:hh:month:day:year to a format mm:ss:hh:month:day:year. The timestamp format can include year, month, day, hour, minutes, seconds, milliseconds, microseconds, and nanoseconds in any combination and/or ordering. Timestamp format converter 803 can thus convert one format to another as required by time input parameters of some sensors, such as sensors S1 and S3.

TX timestamp generators 811-813 can generate a transmit timestamp for sensors of the sensor unit. In one embodiment, TX timestamp generator can simply route the GPS PPS to one or more sensors to provide a GPS PPS signal to the sensors (e.g., S1). Examples of a S1 sensor include Velodyne's LIDAR sensors which accept a GPS time information as an input. The GPS time input information is used to sync the LIDAR sensor to a GPS clock. After the sensor is synced, the LIDAR sensors can trigger/capture a depth image and include a trigger timestamp with the depth image. A second timestamp may be a transmit timestamp which represent a time when sensor S1 transmits sensor data from S1 to sensor unit 500. Here, the trigger timestamp and/or the transmit timestamp may be sent as metadata with the depth image from sensor S1 to sensor unit 500.

Another example of a S1 sensor includes a camera sensor which may accept a mm:ss:hh:month:day:year formatted time information as an input parameter. In this case, TX timestamp generator generates a mm:ss:hh:month:day:year format TX timestamp (as provided by time generation unit 901) to be sent to the camera sensor. The camera sensor can trigger/capture a RGB image having a trigger timestamp which can be derived from the TX timestamp (e.g., accounting for any in between delays). A second timestamp (transmit timestamp) representing when the sensor data is transmitted to sensor unit may be include with the trigger timestamp, as time information metadata. The sensor data along with the time information metadata can then be transmitted from camera sensor to sensor unit 500. Other examples of S1 sensors include RADAR sensors, SONAR sensors, and any sensors that accept a time input parameter.

In another embodiment, TX timestamp generator generates a timestamp in the mm:ss:hh:month:day:year format and provide the generated timestamp for one or more sensors, the mm:ss:hh:month:day:year timestamp having been synchronized with a GPS PPS signal. These sensors (e.g., S3) may transmit sensor data and timestamp metadata (unaltered) directly to host system 110. A direct coupling to host system 110 may be established when no more communication channels are available or when the sensor data only requires a low bandwidth, such as an Ethernet connection. Examples of S3 sensors can include Ethernet, camera and/or RADAR sensors, etc.

RX timestamp generators 821-823 can generate a receive timestamp at the time when sensor unit 500 receives the sensor data and to add the generated receive timestamp as time metadata to the sensor data. So when the sensor data are sent to host system 110, there is available information about a time when sensor unit 500 acquired the sensor data. Examples of sensors that use RX timestamp generators are S1 and S2. The difference between S1 and S2 is that S1 also provides transmit (TX) and/or trigger timestamp information, whereas S2 provides only receive (RX) timestamp information. Examples of S2 sensors include LIDAR, camera and/or RADAR sensors, etc.

In another embodiment, timestamp sync hub device 602 is coupled to host system 110 (e.g., through PCIe bus) to provide a time information (e.g., time information/timestamps 313) to host system 110. The provided time information allows host system 110 to sync an RTC (e.g., CPU-RTC) of host system 110 to the provided time such that a single global time is used among sensor unit 500 and host system 110. Thereafter a planning and control module of host system 110 for the ADV can plan and control the ADV autonomously using a local RTC of host system 110 which is synced to sensor unit 500.

Time source ranking module 603 is used by an ADV when the ADV ignition is turned on in an underground parking garage (e.g., when there is no GPS signal). In one embodiment, because sensor unit 500 or host system 110 still requires a relatively accurate time to generate timestamps, if there lacks information about accuracies of available time sources of sensor unit 500 or the ADV, a default ranking list of time sources can be used to determine a preferred time source. An example of a default ranking list can rank various time sources in an order such as: GPS, FPGA RTC, WIFI, LTE, and CPU RTC. In this case, if the only available time sources are from an FPGA RTC and a WIFI signal, the FPGA RTC time source has priority and is the preferred time source to establish a local time, such as a local time of local timer 753 of FIG. 7. However, as soon as a signal from a GPS sensor is available, in one embodiment, time source ranking module 603 determines accuracy of the different available time sources based on a ranking system.

In one embodiment, time source ranking module 603 generates a histogram based on the absolute difference values of the many available time sources, by a ranking system. The histograms or difference histograms may be generated for a few rounds, or these histograms can be averaged over a predetermined period of time, or as long as the GPS signal is available. The closest time source (e.g., least difference) to the GPS sensor as determined by the difference histogram is selected as the best time source to be used when the GPS signal is unavailable, e.g., the next time the ADV starts ignition in an underground garage. In one embodiment, a CPU RTC is preconfigured to be the preferred time source. In this case, a difference histogram, a delta time, or an average delta time for the CPU RTC is written to a log file or a log buffer by a logger. The difference histogram, a delta time, or an average delta time records a time difference for the CPU RTC and the GPS time. At the next ignition, without a GPS signal, sensor unit 500 can then adjusts the CPU RTC based on the delta time and uses the adjusted CPU RTC as the local time. In one embodiment, when the GPS signal is available, the delta time can be updated to reflect any deviations of the CPU RTC.

Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Figure 9:
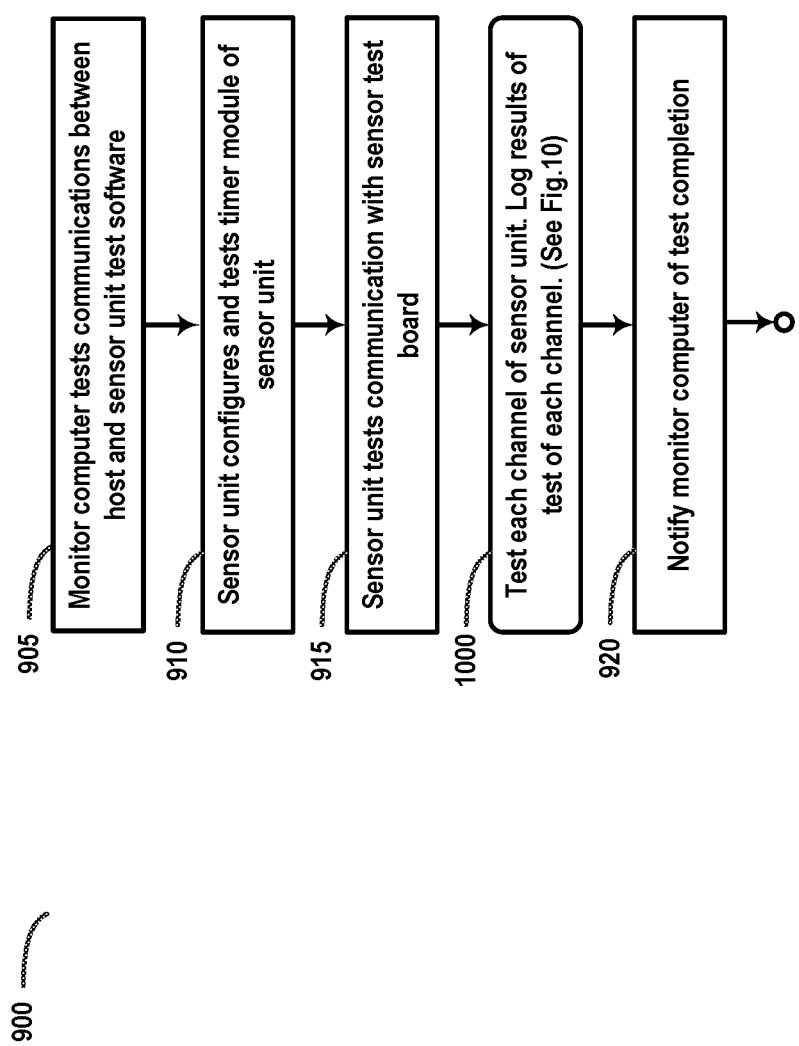
FIG. 9 is a block diagram illustrating a method of testing a sensor unit using a sensor unit test board, according to an embodiment.

FIG. 9 is a block diagram illustrating a method 900 of testing a sensor unit 500 using a sensor unit test board 590 ("test board"). Method 900 assumes that the host computer 110 or monitor computer 594 (collectively and individually, "monitor computer") are connected to the sensor unit 500 that is to be tested using method 900, the sensor unit 500 to be tested is also coupled to the sensor unit test board 590, and that all devices have been powered ON, and performed their own respective power-on self-tests.

In operation 905, monitor computer can attempt communication with sensor unit 500, e.g, by sending a message to sensor test unit software 593 on sensor unit 500, across host interface 505. The message may be as simple as a "ping" which could be a carriage return or other nominal message, to which the sensor unit test software 593 is expected to provide a response. The response may be as simple as an acknowledgement ("ACK"), or a command line prompt character, such as ":", returned to the monitor computer, to establish that communication between the monitor computer and the sensor unit test software 593, across sensor unit host interface 505 is functioning properly. If communication cannot be established between the monitor computer and the sensor unit test software, then the test of the sensor unit 500 fails and the method 900 ends.

In operation 910, sensor unit test software 593 of sensor unit 500 attempts to configure time module 520 of sensor unit 500. Configuration can include writing to registers that initially configure the time module, which can be a known value for all sensor units 500 tested using method 900. After configuration of time module 520, sensor unit test software 593 reads the time module 520 to determine whether the time module 520 was accessible, whether the time module could be configured, and whether the time module returned the expected value to the sensor unit test software 593. If the expected time value was not returned to sensor unit test software 593, then the test of the sensor unit 500 fails. Sensor unit test software 593 can write a failure message to monitor computer, e.g. "sensor unit 500: time module 520 configuration failed," and the method 900 ends.

In operation 915, sensor unit 500 tests communication with sensor unit test board 590. In an embodiment, this test can be similar to the test of operation 905 between the monitor computer and the sensor unit test software 593. The sensor unit test software 593 can send a "ping" to the sensor unit test board 590. Sensor unit test board 590 can respond with a simple acknowledgement ("ACK") of any predetermined character, e.g. ">". If this test fails, then sensor unit test software 593 can send a notification to the monitor computer that communication between the sensor unit 500 and sensor unit test board 590, across sensor interface 504, failed, and method 900 ends. Otherwise, method 900 continues at operation 1000.

Operation 1000 is described in detail below with respect to FIG. 10. Operation 1000 tests each sensor channel 1 . . . N, and each respective sensor processing module 501A-501C and data transfer module 502A-502C, using emulated sensor data 591A-591C, provided by sensor unit test board 590. During the testing of each I/O channel and each emulated sensor across sensor interface 504, a status of the testing of each I/O channel is displayed. In an embodiment, the display can include illuminating a red LED for each failed sensor channel, a green LED for each successfully validated sensor channel, and illuminating a green LED if all sensor channels successfully validated and a red LED is any sensor channel failed validation.

In operation 920, sensor unit test software 593 can notify the monitor computer and/or host computer, of the success or failure of all sensor channels and/or each sensor channel.

Figure 10:
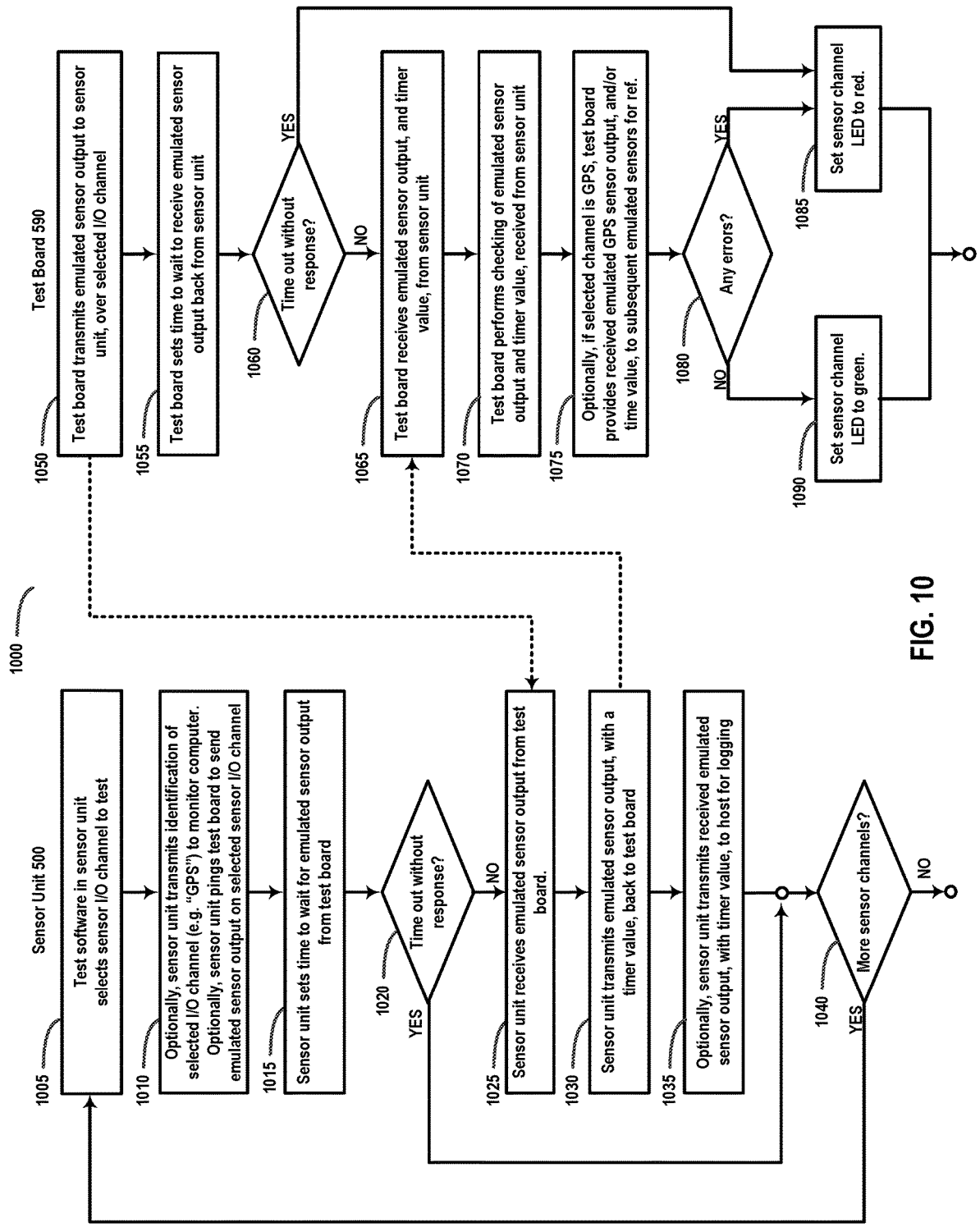
FIG. 10 is a block diagram illustrating a method of testing a sensor unit using a sensor unit test board, according to an embodiment.

FIG. 10 is a block diagram illustrating a method 1000 of testing a sensor unit 500 using a sensor unit test board 590. The testing functionality of the sensor unit 500 is shown at the left in FIG. 10, and the functionality of the sensor unit test board 590 is shown at the right, with dotted lines between the two where interaction takes place. In method 1000, each sensor channel is tested, one at a time, to determine whether the sensor channel is functioning properly.

In operation 1005, test software 593 in sensor unit 500 selects an I/O channel to test. In an embodiment, the first I/O channel selected for test is a GPS sensor channel. In an embodiment, all sensor channels of sensor test board 590 can periodically transmit emulated sensor data for their respective sensor emulators, over an I/O channel associated with the respective sensor emulator, and each I/O channel can be evaluated one at a time. In an embodiment, sensor unit test software 593 of sensor unit 500 manages selection of an I/O channel to test, one at a time. This is the embodiment described herein.

In operation 1010, optionally, sensor unit 500, via sensor unit test software 593, can transmit identification of the I/O channel selected to one, or both, of the sensor unit test board 590 and the monitor computer. In operation 1010, sensor unit test software 593 can optionally "ping" the selected I/O channel across sensor interface 504 to prompt the emulated sensor 591A-591C of sensor unit test board 590, corresponding the selected I/O channel, to send a packet of emulated sensor data to the sensor unit 500 across sensor interface 504.

In operation 1015, sensor unit test software 593 can set a timer for a maximum time to wait for a response from the emulated sensor 591A-591C corresponding to the selected I/O channel.

In operation 1020, it can be determined whether the timer has expired before a response was received on the selected I/O channel for the emulated sensor. If yes, then method 1000 continues at operation 1040, otherwise method 1000 continues at operation 1025.

In operation 1025, a sensor processing module 501A-501C corresponding to the selected I/O channel receives emulated sensor data from one of 591A-591C from sensor unit test board 590 on the selected I/O channel. See operation 1050, described below, for the sensor unit test board 590 functionality corresponding to operation 1025.

In operation 1030, sensor unit test software 593 can obtain a time value from time module 520 and transmit the received emulated sensor data of operation 1025, and the time value obtained from time module 520, to the emulated sensor validity checker in 591A-591C for the selected I/O channel. In an embodiment, the transmission can include an integrity check, such as a checksum, parity bit, Hamming Code, or other data integrity check. See operation 1065, described below, for the sensor unit test board 590 functionality corresponding to operation 1030.

In operation 1035, optionally, sensor unit test software 593 can cause data transfer module 502A-502C to transmit the emulated sensor data across host interface to monitor computer.

In operation 1040, it can be determined whether there are more I/O channels to test. If yes, then method 1000 continues at operation 1005, otherwise, after completion of operations 1065 through 1090, described below, then method 1000 ends.

Referring now to the right hand side of FIG. 10, which describes the functionality of the sensor unit test board 590 ("test board 590"), in operation 1050, test board 590 transmits emulated sensor data for the selected I/O channel to the sensor unit 500. This emulated sensor data is received by the sensor unit 500, as described above in operation 1025.

In operation 1055, test board 590 sets a time to wait for receive emulated data and a time value from the test board 500, in response to the test board 590 sending emulated sensor data to the sensor unit 500.

In operation 1060, if the timer has expired and no response has been received from the sensor unit 500, then method 1000 continues at operation 1085, otherwise method 1000 continues at operation 1065.

In operation 1065, test board 590 receives emulated sensor data and a time value back from sensor unit 500 on the selected I/O channel. The emulated sensor 591A-591C configured for the selected I/O channel receives the emulated sensor data, time value, and optionally an integrity check, e.g. parity, checksum, Hamming Code, et al., as transmitted by sensor unit 500 as described above in operation 1030.

In operation 1070, test board 590 performs validity checking of the received emulated sensor data, time value, and integrity check. The validity check is performed by the validity checker of the emulated sensor 591A-591C corresponding to the selected I/O channel. Validity checking is described in detail, above, with reference to FIGS. 5A and 5B.

In operation 1075, optionally, if the selected sensor is GPS, test board 590 can provide the received emulated GPS sensor data, and/or time value, to one or more emulated sensors 591B-591C corresponding to subsequent I/O channels yet to be tested.

In operation 1080, it can be determined whether any validity check errors were found by the validity checker of the emulated sensor corresponding to the selected I/O channel. If so, then method 1000 continues at operation 1085, otherwise method 1000 continues at operation 1090.

In operation 1085, an indicator of failure of the I/O channel can be indicated, such as be illuminated a red LED on the sensor unit test board 590 in association with the I/O channel just tested. In an embodiment, an indication of failure of this I/O channel can also be sent to the monitor computer, e.g., in text form. The test board 590 portion of method 1000 ends for this I/O channel. Loop control for iterating through all I/O channels is controlled by the sensor unit 500 in operation 1040, above.

In operation 1090, an indicator of success of the I/O channel can be indicated, such as be illuminated a green LED on the sensor unit test board 590 in association with the I/O channel just tested. In an embodiment, an indication of success of this I/O channel can also be sent to the monitor computer, e.g., in text form. The test board 590 portion of method 1000 ends for this I/O channel. Loop control for iterating through all I/O channels is controlled by the sensor unit 500 in operation 1040, above.

Figure 11:
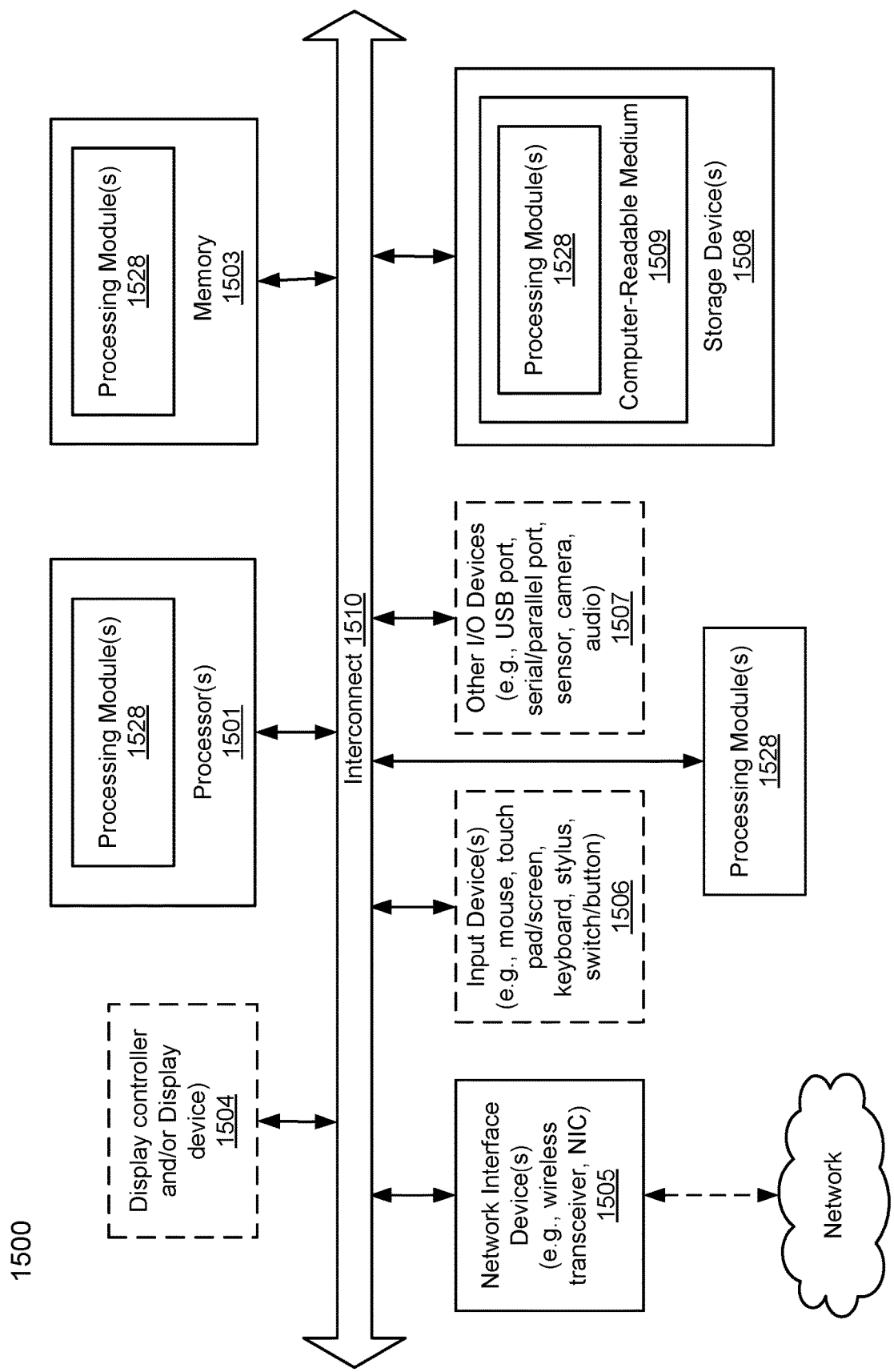
FIG. 11 is a block diagram of computing system that can be used to implement the functionality described herein, according to an embodiment.

FIG. 11 is a block diagram illustrating an example of a data processing system which may be used with one embodiment of the disclosure. For example, system 1500 may represent any of data processing systems described above performing any of the processes or methods described above, such as, for example, perception and planning system 110 or any of servers 103-104 of FIG. 1. System 1500 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system.

Note also that system 1500 is intended to show a high level view of many components of the computer system. However, it is to be understood that additional components may be present in certain implementations and furthermore, different arrangement of the components shown may occur in other implementations. System 1500 may represent a desktop, a laptop, a tablet, a server, a mobile phone, a media player, a personal digital assistant (PDA), a Smartwatch, a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 1500 includes processor 1501, memory 1503, and devices 1505-1508 connected via a bus or an interconnect 1510. Processor 1501 may represent a single processor or multiple processors with a single processor core or multiple processor cores included therein. Processor 1501 may represent one or more general-purpose processors such as a microprocessor, a central processing unit (CPU), or the like. More particularly, processor 1501 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 1501 may also be one or more special-purpose processors such as an application specific integrated circuit (ASIC), a cellular or baseband processor, a field programmable gate array (FPGA), a digital signal processor (DSP), a network processor, a graphics processor, a communications processor, a cryptographic processor, a co-processor, an embedded processor, or any other type of logic capable of processing instructions.

Processor 1501, which may be a low power multi-core processor socket such as an ultra-low voltage processor, may act as a main processing unit and central hub for communication with the various components of the system. Such processor can be implemented as a system on chip (SoC). Processor 1501 is configured to execute instructions for performing the operations and steps discussed herein. System 1500 may further include a graphics interface that communicates with optional graphics subsystem 1504, which may include a display controller, a graphics processor, and/or a display device.

Processor 1501 may communicate with memory 1503, which in one embodiment can be implemented via multiple memory devices to provide for a given amount of system memory. Memory 1503 may include one or more volatile storage (or memory) devices such as random access memory (RAM), dynamic RAM (DRAM), synchronous DRAM (SDRAM), static RAM (SRAM), or other types of storage devices. Memory 1503 may store information including sequences of instructions that are executed by processor 1501, or any other device. For example, executable code and/or data of a variety of operating systems, device drivers, firmware (e.g., input output basic system or BIOS), and/or applications can be loaded in memory 1503 and executed by processor 1501. An operating system can be any kind of operating systems, such as, for example, Robot Operating System (ROS), Windows® operating system from Microsoft®, Mac OS®/iOS® from Apple, Android® from Google®, LINUX, UNIX, or other real-time or embedded operating systems.

System 1500 may further include IO devices such as devices 1505-1508, including network interface device(s) 1505, optional input device(s) 1506, and other optional IO device(s) 1507. Network interface device 1505 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 1506 may include a mouse, a touch pad, a touch sensitive screen (which may be integrated with display device 1504), a pointer device such as a stylus, and/or a keyboard (e.g., physical keyboard or a virtual keyboard displayed as part of a touch sensitive screen). For example, input device 1506 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 1507 may include an audio device. An audio device may include a speaker and/or a microphone to facilitate voice-enabled functions, such as voice recognition, voice replication, digital recording, and/or telephony functions. Other IO devices 1507 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. Devices 1507 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 1510 via a sensor hub (not shown), while other devices such as a keyboard or thermal sensor may be controlled by an embedded controller (not shown), dependent upon the specific configuration or design of system 1500.

To provide for persistent storage of information such as data, applications, one or more operating systems and so forth, a mass storage (not shown) may also couple to processor 1501. In various embodiments, to enable a thinner and lighter system design as well as to improve system responsiveness, this mass storage may be implemented via a solid state device (SSD). However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 1501, e.g., via a serial peripheral interface (SPI). This flash device may provide for non-volatile storage of system software, including BIOS as well as other firmware of the system.

Storage device 1508 may include computer-accessible storage medium 1509 (also known as a machine-readable storage medium or a computer-readable medium) on which is stored one or more sets of instructions or software (e.g., module, unit, and/or logic 1528) embodying any one or more of the methodologies or functions described herein. Processing module/unit/logic 1528 may represent any of the components described above, such as, for example, perception module 302, planning module 305, control module 306, and/or sensor unit 500. Processing modules 1528 can further include sensor unit test software 593, emulated sensor data validity checkers for various types of emulated sensors, and other logic to implement the functionality described herein. Processing module/unit/logic 1528 may also reside, completely or at least partially, within memory 1503 and/or within processor 1501 during execution thereof by data processing system 1500, memory 1503 and processor 1501 also constituting machine-accessible storage media. Processing module/unit/logic 1528 may further be transmitted or received over a network via network interface device 1505.

Computer-readable storage medium 1509 may also be used to store the some software functionalities described above persistently. While computer-readable storage medium 1509 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media, or any other non-transitory machine-readable medium.

Processing module/unit/logic 1528, components and other features described herein can be implemented as discrete hardware components or integrated in the functionality of hardware components such as ASICS, FPGAs, DSPs or similar devices. In addition, processing module/unit/logic 1528 can be implemented as firmware or functional circuitry within hardware devices. Further, processing module/unit/logic 1528 can be implemented in any combination hardware devices and software components.

Note that while system 1500 is illustrated with various components of a data processing system, it is not intended to represent any particular architecture or manner of interconnecting the components; as such details are not germane to embodiments of the present disclosure. It will also be appreciated that network computers, handheld computers, mobile phones, servers, and/or other data processing systems which have fewer components or perhaps more components may also be used with embodiments of the disclosure.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A computer-implemented method of verifying functionality of a sensor unit under test, coupled to a sensor unit test board via a sensor interface, the method comprising:
    configuring the sensor unit into a test mode using test software included within the sensor unit;
    selecting a first channel of the sensor interface associated with a first emulated sensor that emulates functionality of a first real sensor;
    transmitting, by the first channel to a first sensor processing module of the sensor unit under test, first emulated sensor data corresponding to the first emulated sensor, the first emulated sensor data having been generated by the first emulated sensor in the sensor unit test board, wherein the sensor unit includes at least one sensor processing module to process sensor data obtained from one or more sensors mounted on an autonomous driving vehicle (ADV), and wherein the processed sensor data is utilized to perceive a driving environment surrounding the ADV;
    receiving, by a validity checker of the sensor unit test board, for the first emulated sensor, the first emulated sensor data over the first channel from the first sensor processing module for the sensor unit under test and a first time value associated with the first emulated sensor data;
    determining, by the validity checker, whether there is an error in the received emulated first data or the first time value; and
    in response to the validity checker detecting one or more errors in the received first emulated data or the first time value, displaying at least one first failure indication associated with the first emulated sensor data and first channel of the sensor unit under test.

2. The method of claim 1, wherein detecting one or more errors comprises verifying that the received first emulated data is a transformation from the transmitted first emulated data complying with a predetermined rule.

3. The method of claim 1, wherein detecting one or more errors comprises verifying that received first emulated data and the transmitted first emulated data are the same.

4. The method of claim 1, wherein detecting one or more errors comprises determining whether the format of the received first emulated data matches a data format for the real first sensor corresponding to the emulated first sensor.

5. The method of claim 4, wherein detecting one or more errors further comprises verifying one or more of:
    a format of the first time value; or
    a range of the first time value.

6. The method of claim 1, wherein the first emulated sensor is an emulated global positioning satellite (GPS) sensor.

7. The method of claim 6, further comprising:
    passing the emulated GPS sensor data and first time value from the emulated GPS sensor to a second emulated sensor.

8. The method of claim 7, further comprising:
    generating and transmitting second emulated sensor data, including the GPS time value, over a second channel corresponding to a second sensor, to a second sensor processing module of the sensor unit under test, the generating based at least in part on the emulated GPS sensor data or the first time value;
    receiving the second emulated sensor data from the second sensor processing module over the second channel, from the sensor unit under test, and a second value associated with the emulated GPS sensor data; and
    in response to detecting one or more errors in the received second emulated data or the second time value, displaying at least one second failure indication associated with the second emulated sensor data and second channel of the sensor unit under test.

9. A non-transitory machine-readable medium having instructions stored therein, which when executed by a processor, cause the processor to perform operations of verifying functionality of a sensor unit under test, coupled to a sensor unit test board via a sensor interface, the operations comprising:
    configuring the sensor unit into a test mode using test software included within the sensor unit;
    selecting a first channel of the sensor interface associated with a first emulated sensor that emulates functionality of a first real sensor;
    transmitting, by the first channel to a first sensor processing module of the sensor unit under test, first emulated sensor data corresponding to the first emulated sensor, the first emulated sensor data having been generated by the first emulated sensor in the sensor unit test board, wherein the sensor unit includes at least one sensor processing module to process sensor data obtained from one or more sensors mounted on an autonomous driving vehicle (ADV), and wherein the processed sensor data is utilized to perceive a driving environment surrounding the ADV;
    receiving, by a validity checker of the sensor unit test board, for the first emulated sensor, the first emulated sensor data over the first channel from the first sensor processing module, the sensor unit under test and a time value associated with the first emulated sensor data;
    determining, by the validity checker, whether there is an error in the received emulated first data or the first time value; and
    in response to the validity checker detecting one or more errors in the received first emulated data or the first time value, displaying at least one first failure indication associated with the first emulated sensor data and first channel of the sensor unit under test.

10. The medium of claim 9, wherein detecting one or more errors comprises verifying that the received first emulated data is a transformation from the transmitted first emulated data complying with a predetermined rule.

11. The medium of claim 9, wherein detecting one or more errors comprises verifying that received first emulated data and the transmitted first emulated data are the same.

12. The medium of claim 9, wherein detecting one or more errors comprises determining whether the format of the received first emulated data matches a data format for a real first sensor corresponding to the emulated first sensor.

13. The medium of claim 12, wherein detecting one or more errors further comprises verifying one or more of:
    a format of the time value; or
    a range of the time value.

14. The medium of claim 9, wherein the first emulated sensor is an emulated global positioning satellite (GPS) sensor.

15. The medium of claim 14, wherein the operations further comprise:
passing the emulated GPS sensor data and first time value from the emulated GPS sensor to a second emulated sensor.

16. The medium of claim 15, wherein the operations further comprise:
generating and transmitting second emulated sensor data, including the GPS time value, over a second channel corresponding to a second sensor, to a second sensor processing module of the sensor unit under test;
receiving second emulated sensor data from the second sensor processing module over the second channel, from the sensor unit under test, and a second value associated with the emulated GPS sensor data; and
in response to detecting one or more errors in the received second emulated data or the second time value, displaying at least one second failure indication associated with the second emulated sensor data and second channel of the sensor unit under test.

17. A data processing system, comprising:
a processor; and
a memory coupled to the processor to store instructions, which when executed by the processor, cause the processor to perform operations of verifying functionality of a sensor unit, coupled to a sensor unit test board via a sensor interface, the operations including
configuring the sensor unit into a test mode using test software included within the sensor unit;
selecting a first channel of the sensor interface associated with a first emulated sensor that emulates functionality of a first real sensor;
transmitting, by the first channel to a first sensor processing module of the sensor unit under test, first emulated sensor data corresponding to the first emulated sensor, the first emulated sensor data having been generated by the first emulated sensor in the sensor unit test board, wherein the sensor unit includes at least one sensor processing module to process sensor data obtained from one or more sensors mounted on an autonomous driving vehicle (ADV), and wherein the processed sensor data is utilized to perceive a driving environment surrounding the ADV,
receiving, by a validity checker of the sensor unit test board, for the first emulated sensor, the first emulated sensor data over the first channel from the first sensor processing module for the sensor unit under test and a time value associated with the first emulated sensor data,
determining, by the validity checker, whether there is an error in the received emulated first data or the first time value; and
in response to the validity checker detecting one or more errors in the received first emulated data or the first time value, displaying at least one first failure indication associated with the first emulated sensor data and first channel of the sensor unit under test.

18. The system of claim 17, wherein detecting one or more errors comprises verifying that the received first emulated data is a transformation from the transmitted first emulated data complying with a predetermined rule.

19. The system of claim 17, wherein detecting one or more errors comprises verifying that received the emulated data and the transmitted first emulated data are the same.

20. The system of claim 17, wherein detecting one or more errors comprises determining whether the format of the received first emulated data matches a data format for the real first sensor corresponding to the emulated first sensor.

21. The system of claim 17, wherein detecting one or more errors further comprises verifying one or more of:
a format of the time value; or
a range of the time value.

22. The system of claim 17, wherein the first emulated sensor is an emulated global positioning satellite (GPS) sensor.

23. The system of claim 22, wherein the operations further comprise:
passing the emulated GPS sensor data from the emulated GPS sensor to a second emulated sensor.

24. The system of claim 23, wherein the operations further comprise:
generating and transmitting second emulated sensor data, including the GPS time value, over a second channel corresponding to a second sensor, to a second sensor processing module of the sensor unit under test, the generating based at least in part on the first emulated GPS data or the first time value;
receiving the second emulated sensor data from the second sensor processing module over the second channel, from the sensor unit under test, and a second value associated with the emulated GPS sensor data; and
in response to detecting one or more errors in the received second emulated data or the second time value, displaying at least one second failure indication associated with the second emulated sensor data and second channel of the sensor unit under test.

* * * * *